(12) United States Patent
Huang

(10) Patent No.: US 12,218,242 B2
(45) Date of Patent: Feb. 4, 2025

(54) SEMICONDUCTOR STRUCTURE

(71) Applicant: TAIWAN SEMICONDUCTOR MANUFACTURING COMPANY LTD., Hsinchu (TW)

(72) Inventor: Yu-Lien Huang, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 18/336,005

(22) Filed: Jun. 15, 2023

(65) Prior Publication Data
US 2023/0327022 A1 Oct. 12, 2023

Related U.S. Application Data

(62) Division of application No. 17/232,614, filed on Apr. 16, 2021, now Pat. No. 11,721,764.

(51) Int. Cl.
| | |
|---|---|
| H01L 29/76 | (2006.01) |
| H01L 21/8234 | (2006.01) |
| H01L 27/088 | (2006.01) |
| H01L 29/06 | (2006.01) |
| H01L 29/66 | (2006.01) |
| H01L 29/78 | (2006.01) |
| H01L 29/94 | (2006.01) |

(52) U.S. Cl.
CPC .. *H01L 29/7851* (2013.01); *H01L 21/823431* (2013.01); *H01L 21/823481* (2013.01); *H01L 27/0886* (2013.01); *H01L 29/0649* (2013.01); *H01L 29/66795* (2013.01)

(58) Field of Classification Search
CPC ......... H01L 29/7851; H01L 21/823431; H01L 21/823481; H01L 27/0886; H01L 29/0649; H01L 29/66795
USPC ........................................................ 257/288
See application file for complete search history.

(56) References Cited

U.S. PATENT DOCUMENTS

2020/0279768 A1* 9/2020 Kamineni ......... H01L 29/41791

* cited by examiner

*Primary Examiner* — Theresa T Doan
(74) *Attorney, Agent, or Firm* — WPAT LAW; Anthony King

(57) ABSTRACT

A semiconductor structure includes at least a fin structure, a gate structure over the fin structure, a connecting structure, a first dielectric structure over the gate structure, and a second dielectric structure. The fin structure extends in a first direction, and the gate structure extends in a second direction different from the first direction. The connecting structure is disposed over the fin structure and isolated from the gate structure. The second dielectric structure extends in the first direction. The first dielectric structure and the second dielectric structure include a same material. A top surface of the first dielectric structure and a top surface of the second dielectric structure are substantially aligned with each other.

20 Claims, 33 Drawing Sheets

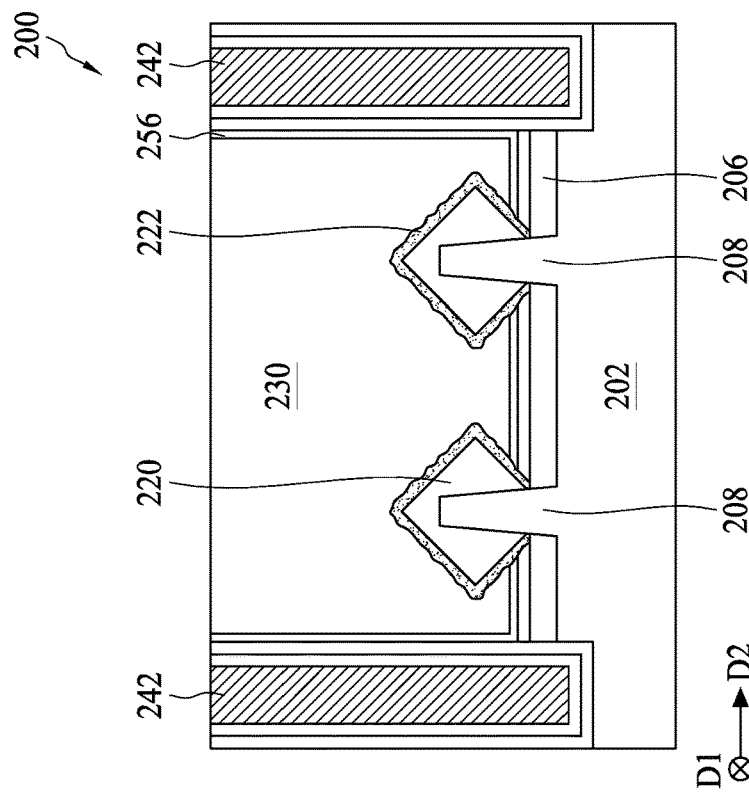
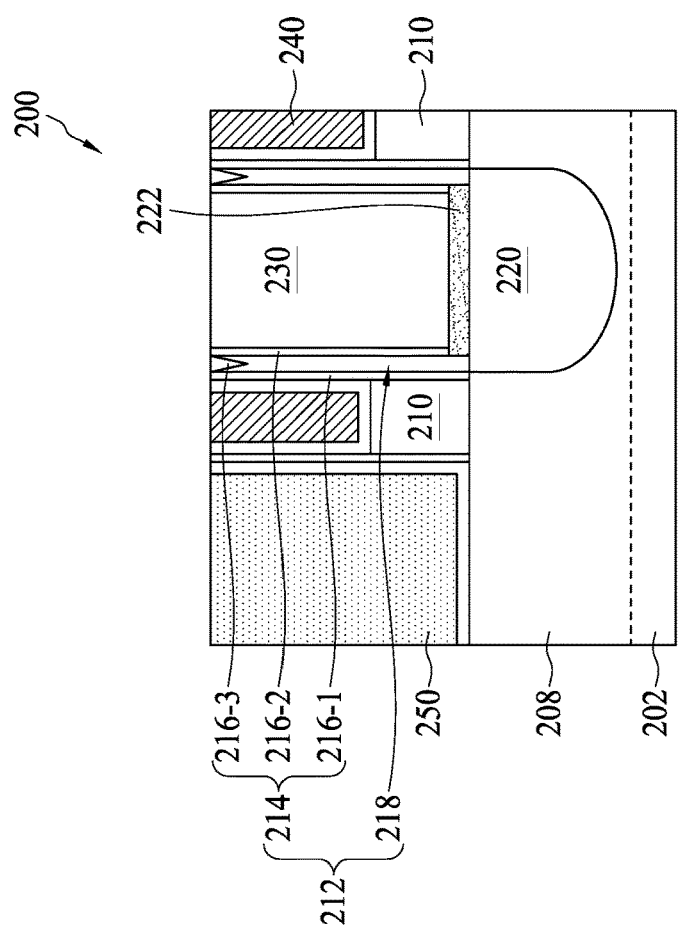
FIG. 5A
FIG. 5B

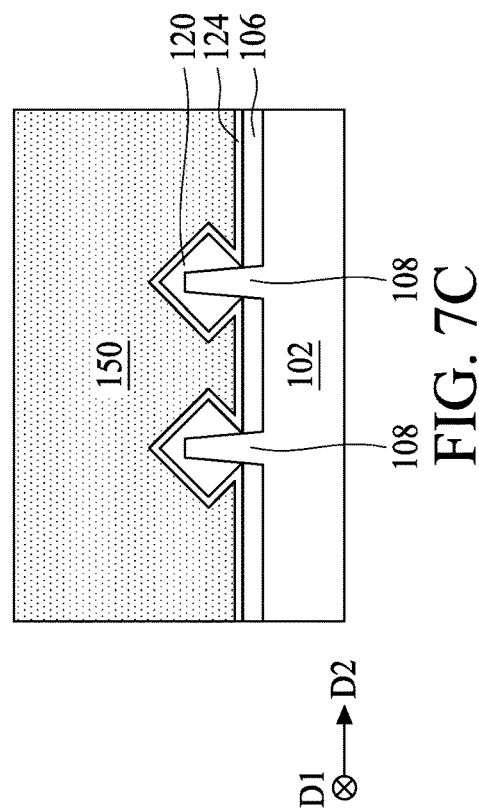
FIG. 7B
FIG. 7C
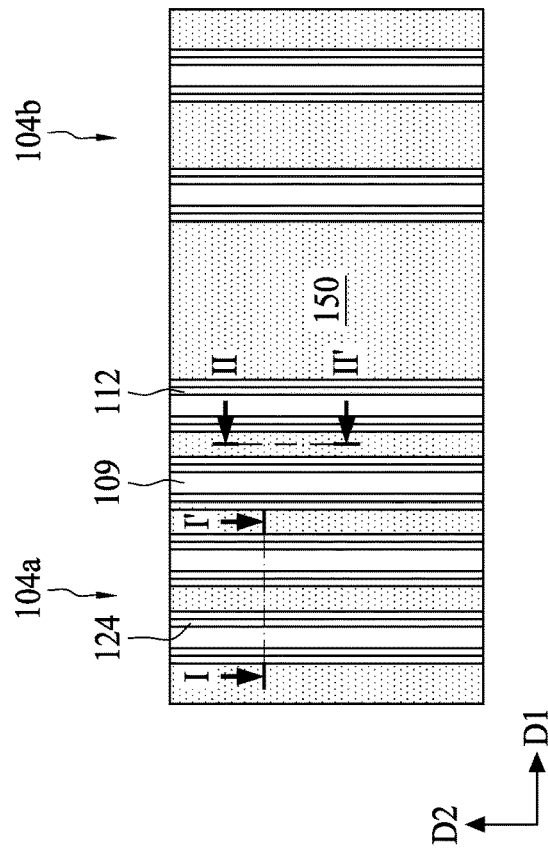
FIG. 7A

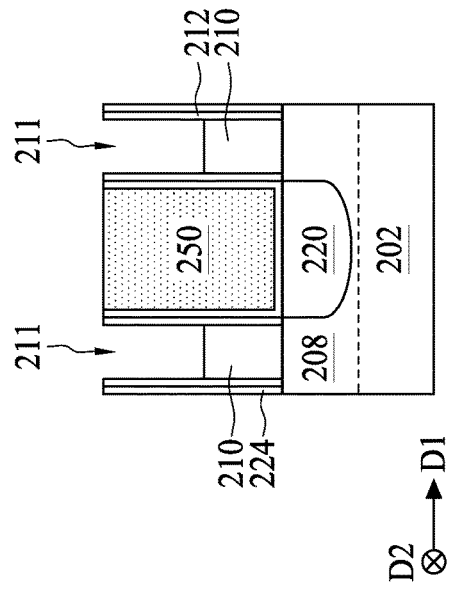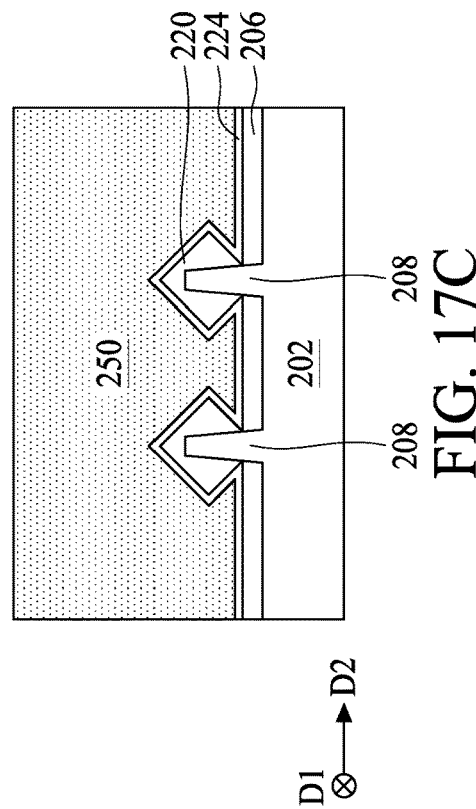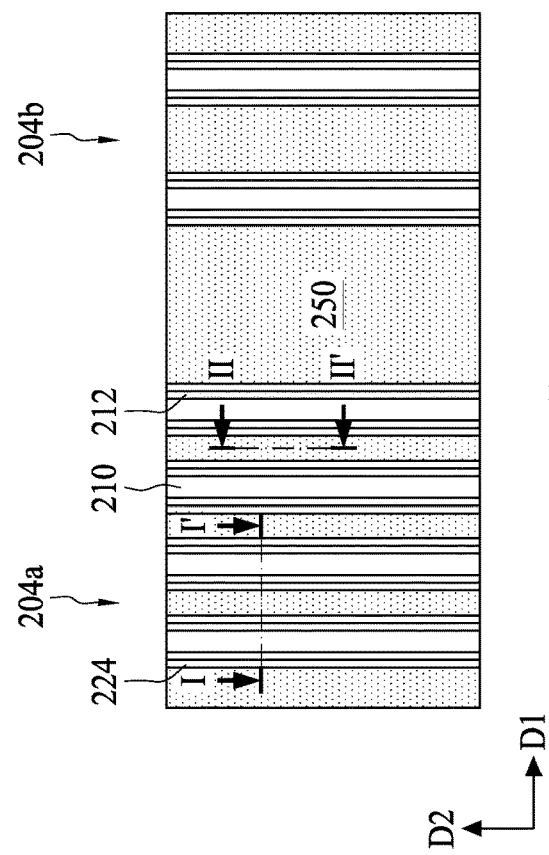
FIG. 17B
FIG. 17C
FIG. 17A

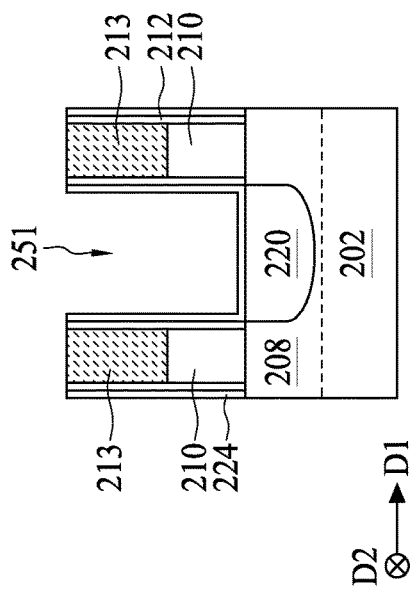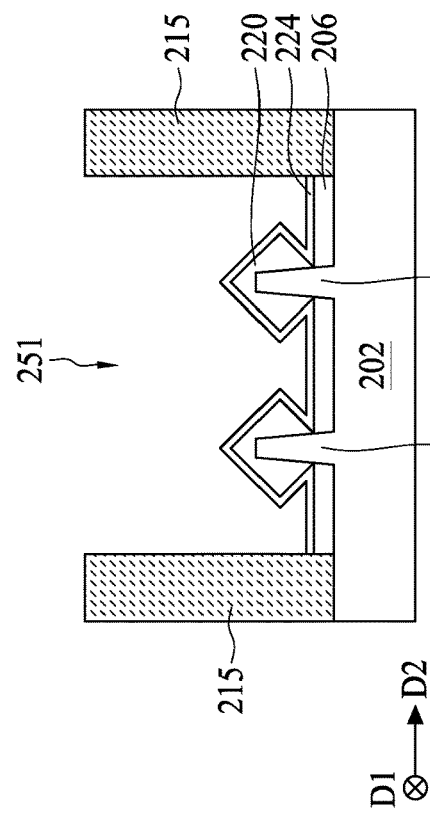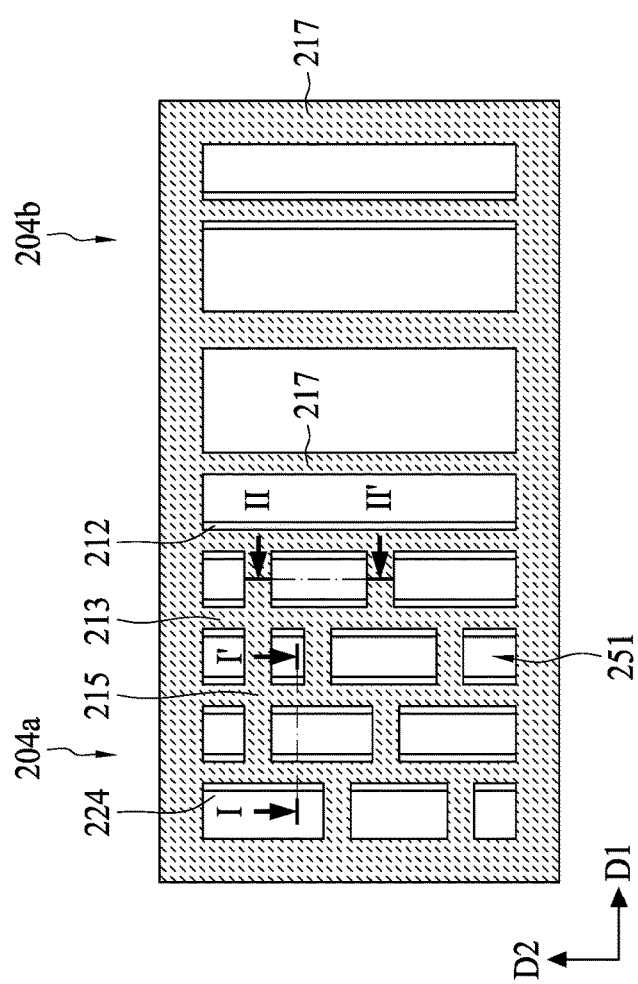

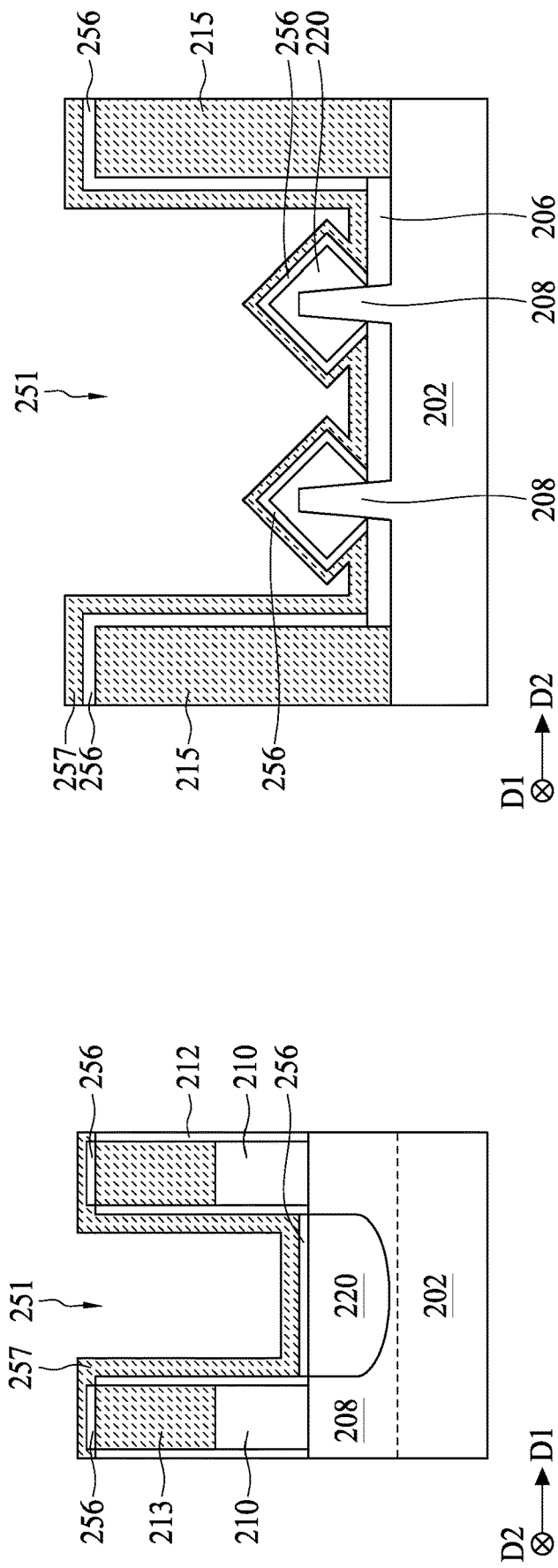

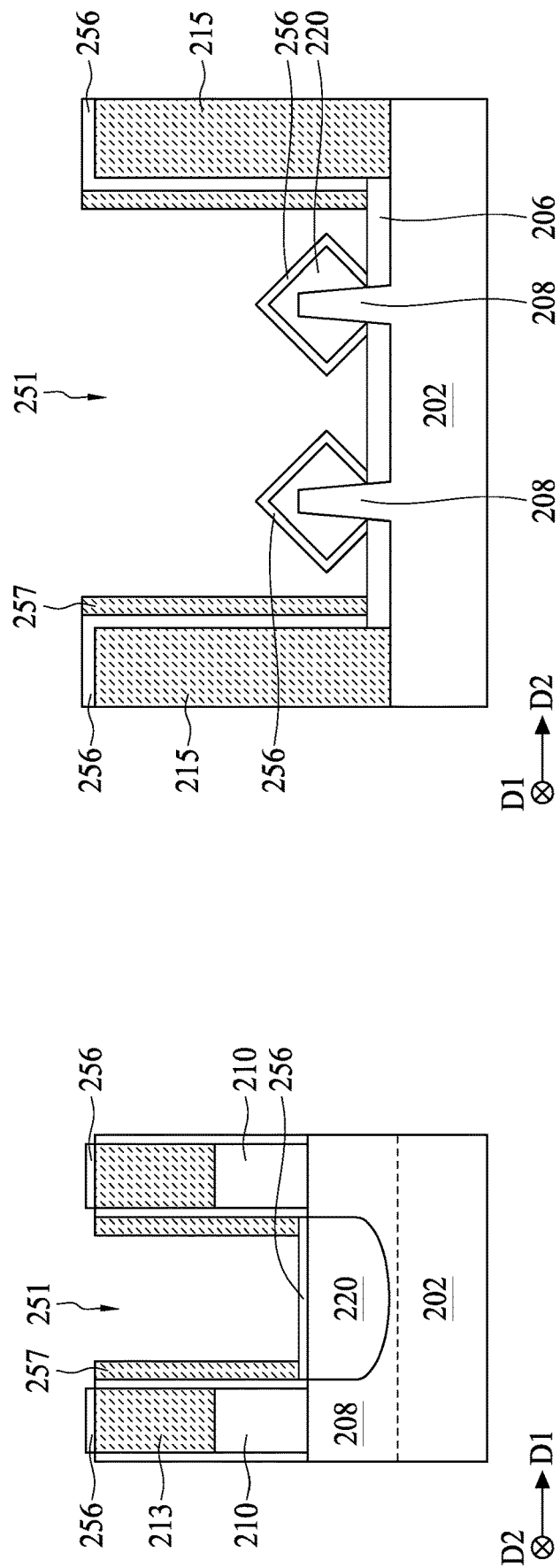

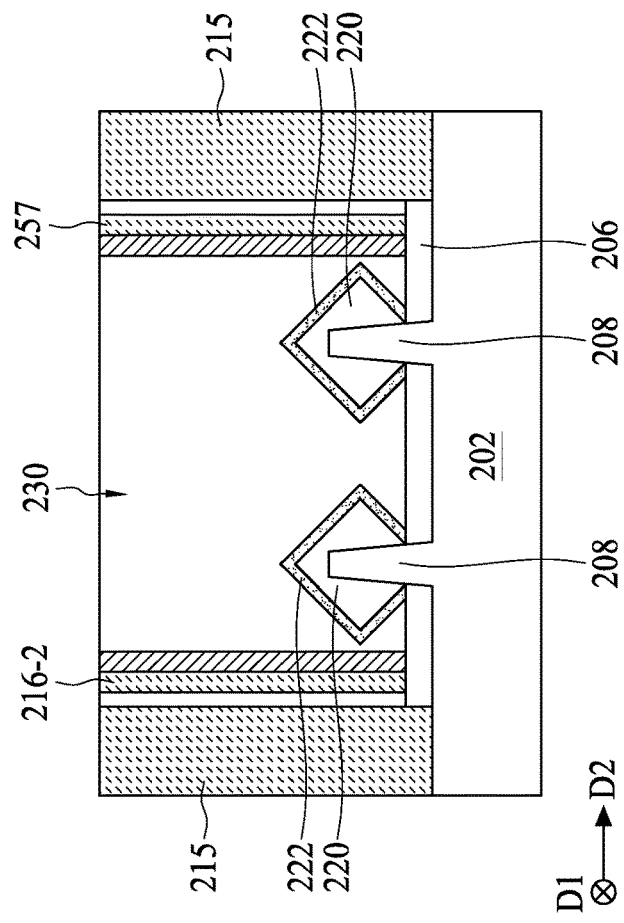
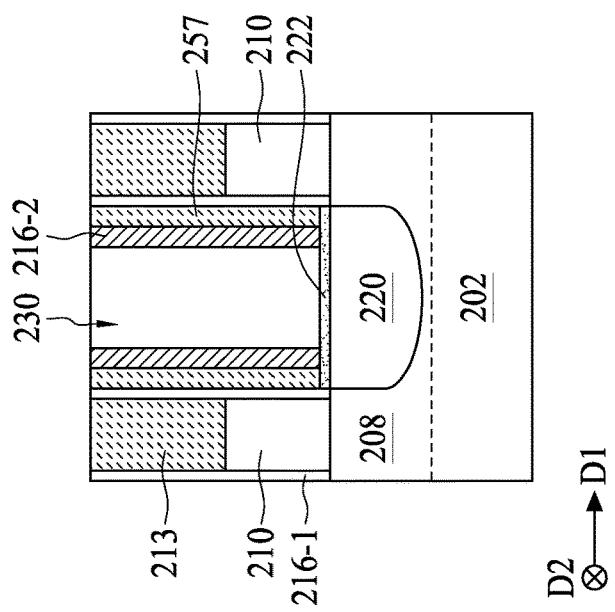
FIG. 29B
FIG. 29A

SEMICONDUCTOR STRUCTURE

PRIORITY CLAIM AND CROSS-REFERENCE

This patent is a divisional application of U.S. patent application Ser. No. 17/232,614, filed on Apr. 16, 2021, entitled of "SEMICONDUCTOR STRUCTURE AND METHOD FOR FORMING THE SAME, which is incorporated by reference in its entirety.

BACKGROUND

The semiconductor integrated circuit (IC) industry has experienced rapid growth. Technological advances in IC materials and design have produced continuous improvements in generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, as the feature sizes continue to decrease, fabrication processes continue to become more difficult to perform. Thus, there is a challenge to form reliable semiconductor devices with smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a schematic drawing illustrating a cross-sectional view of the semiconductor structure of FIG. 4 along line I-I' according to aspects of the present disclosure in one or more embodiments.

FIG. 5B is a schematic drawing illustrating a cross-sectional view of the semiconductor structure of FIG. 4 along line II-II' according to aspects of the present disclosure in one or more embodiments.

FIG. 7A is a schematic drawing illustrating a schematic top view of a semiconductor structure at a stage in a method for forming a semiconductor structure according to aspects of one or more embodiments of the present disclosure, FIG. 7B is a schematic drawing illustrating a cross-sectional view of the semiconductor structure of FIG. 7A along line I-I', and FIG. 7C is a schematic drawing illustrating a cross-sectional view of the semiconductor structure of FIG. 7A along line II-II'.

FIG. 17A is a schematic drawing illustrating a schematic top view of a semiconductor structure at a stage subsequent to that of FIG. 16A, FIG. 17B is a schematic drawing illustrating a cross-sectional view of the semiconductor structure of FIG. 17A along line I-I', and FIG. 17C is a schematic drawing illustrating a cross-sectional view of the semiconductor structure of FIG. 17A along line II-II'.

FIG. 20A is a schematic drawing illustrating a schematic top view of a semiconductor structure at a stage subsequent to that of FIG. 19A, FIG. 20B is a schematic drawing illustrating a cross-sectional view of the semiconductor structure of FIG. 20A along line I-I', and FIG. 20C is a schematic drawing illustrating a cross-sectional view of the semiconductor structure of FIG. 20A along line II-II'.

FIG. 24A is a schematic drawing illustrating a schematic top view of a semiconductor structure at a stage subsequent to that of FIGS. 23A, and 24B is a schematic drawing illustrating a schematic top view of a semiconductor structure at a stage subsequent to that of FIG. 23B.

FIG. 25A is a schematic drawing illustrating a schematic top view of a semiconductor structure at a stage subsequent to that of FIGS. 24A, and 25B is a schematic drawing illustrating a schematic top view of a semiconductor structure at a stage subsequent to that of FIG. 24B.

FIG. 29A is a schematic drawing illustrating a schematic top view of a semiconductor structure at a stage subsequent to that of FIG. 28A, and FIG. 29B is a schematic drawing illustrating a schematic top view of a semiconductor structure at a stage subsequent to that of FIG. 28B.

DETAILED DESCRIPTION

Figure 1:
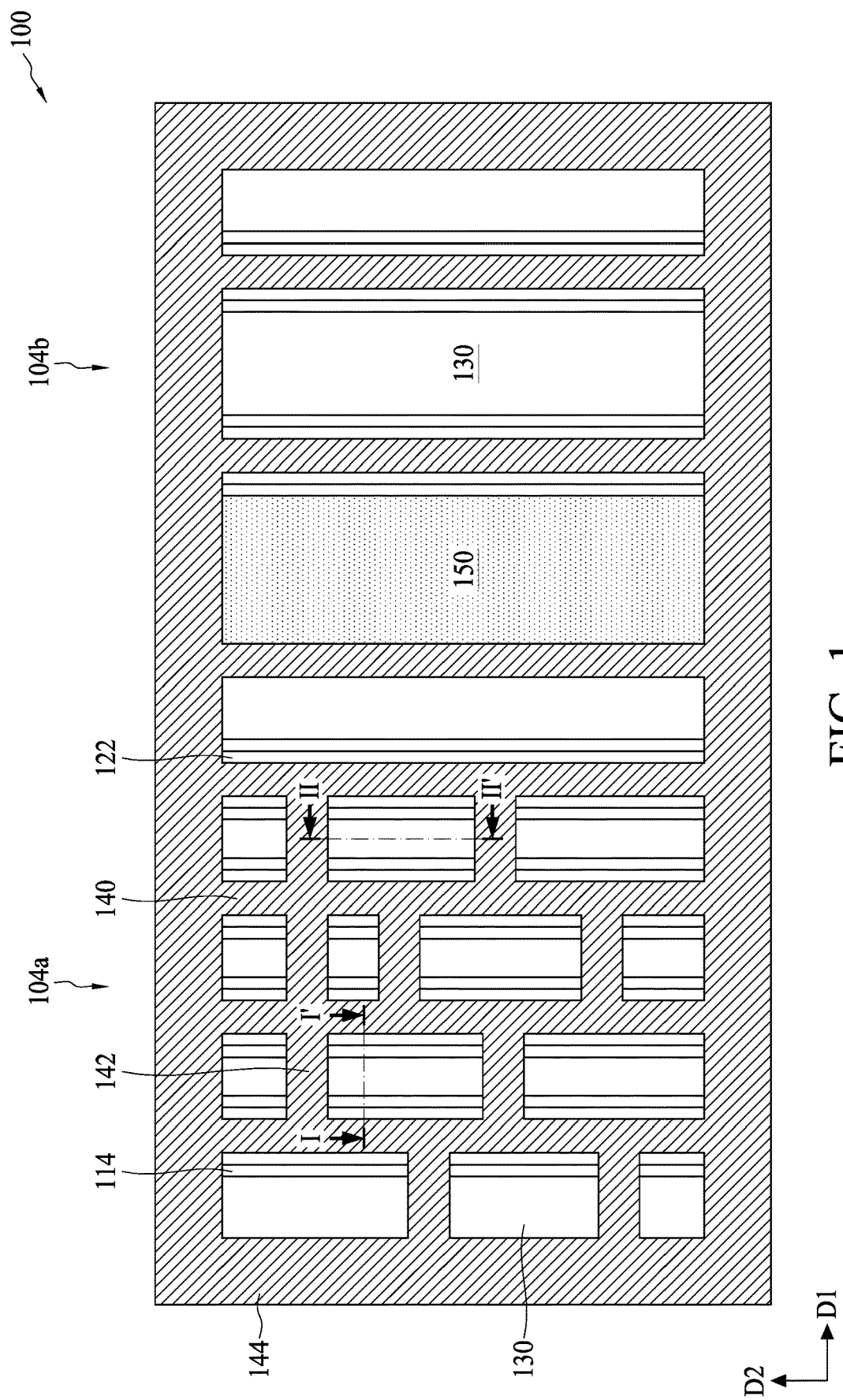
FIG. 1 is a schematic drawing illustrating a top view of a semiconductor structure according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

IC manufacturing process flow can typically be divided into three categories: front-end-of-line (FEOL), middle-end-of-line (MEOL) and back-end-of-line (BEOL). FEOL generally encompasses processes related to fabrication of IC devices, such as transistors. For example, FEOL processes can include forming isolation structures for isolating IC devices, gate structures, and source and drain structures (also referred to as source/drain structures) that form a transistor. MEOL generally encompasses processes related to fabrication of connecting structures (also referred to as contacts or plugs) that connect to conductive features (or conductive regions) of the IC devices. For example, MEOL processes can include forming connecting structures that connect to the gate structures and connecting structures that connect to the source/drain structures. BEOL generally encompasses processes related to fabrication of multilayer interconnect (MLI) structures that electrically connect the IC devices and the connecting structures fabricated by FEOL and MEOL process. Accordingly, operation of the IC devices can be enabled.

As mentioned above, because the feature sizes continue to decrease, fabrication processes continue to become more difficult to perform. For example, when forming the MEOL connecting structures, an etching issue can arise due to different dimensions. In some comparative approaches, vias or openings of different sizes may be simultaneously formed in a dielectric structure for accommodating connecting structures. Unwanted dielectric loss may occur at the opening of greater size. In some comparative approaches, a leakage issue may arise due to severe dielectric loss.

The present disclosure therefore provides a semiconductor structure and a method to mitigate the dielectric loss issue. In some embodiments, the semiconductor structure provides first and second dielectric structures for defining locations and dimensions of MEOL connecting structures. Further, the first and second dielectric structures provide greater selectivity such that unwanted dielectric loss may be mitigated. In some embodiments, the first and second dielectric structures may include low-k material such that capacitance between the MEOL connecting structures and FEOL devices may be reduced. In some embodiments, the semiconductor structure may further include an air spacer for further reducing capacitance.

Figures 2A, 2B:
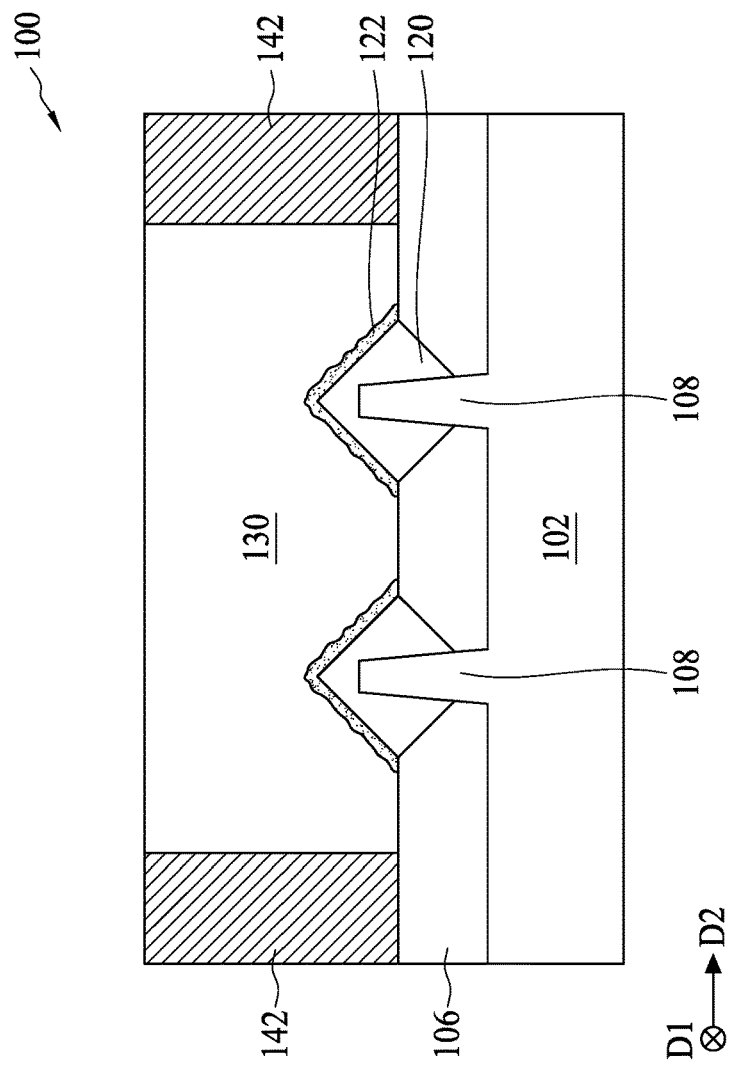
FIG. 2A is a schematic drawing illustrating a cross-sectional view of the semiconductor structure of FIG. 1 along line I-I' according to aspects of the present disclosure in one or more embodiments.
FIG. 2B is a schematic drawing illustrating a cross-sectional view of the semiconductor structure of FIG. 1 along line II-II' according to aspects of the present disclosure in one or more embodiments.
Figure 2C:
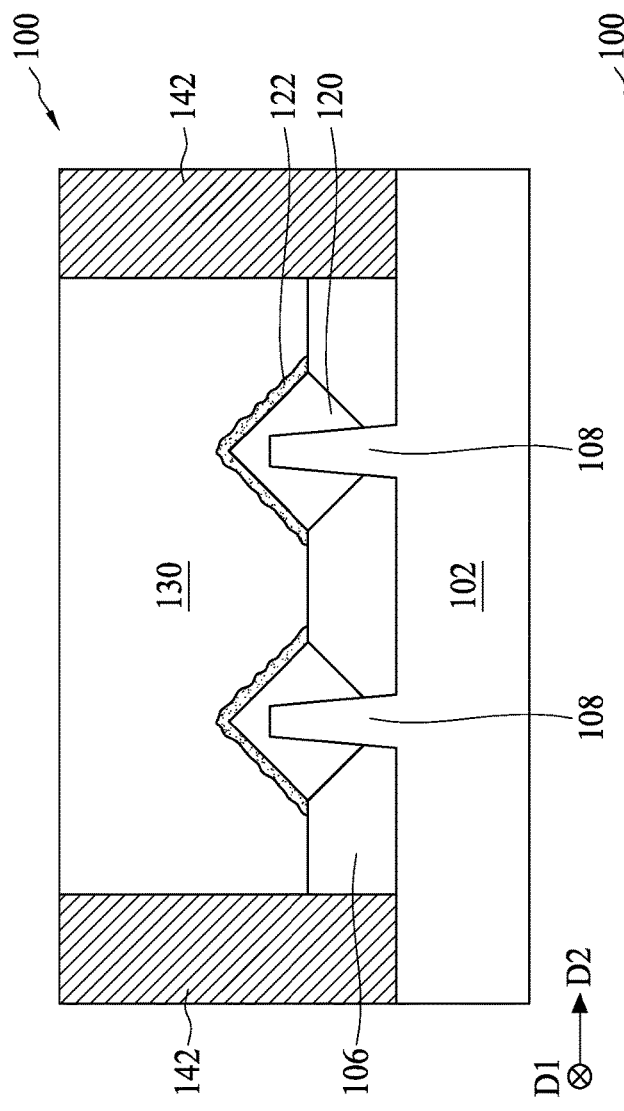
FIG. 2C is a schematic drawing illustrating a cross-sectional view of the semiconductor structure of FIG. 1 along line II-II' according to aspects of the present disclosure in one or more embodiments.
Figure 2D:
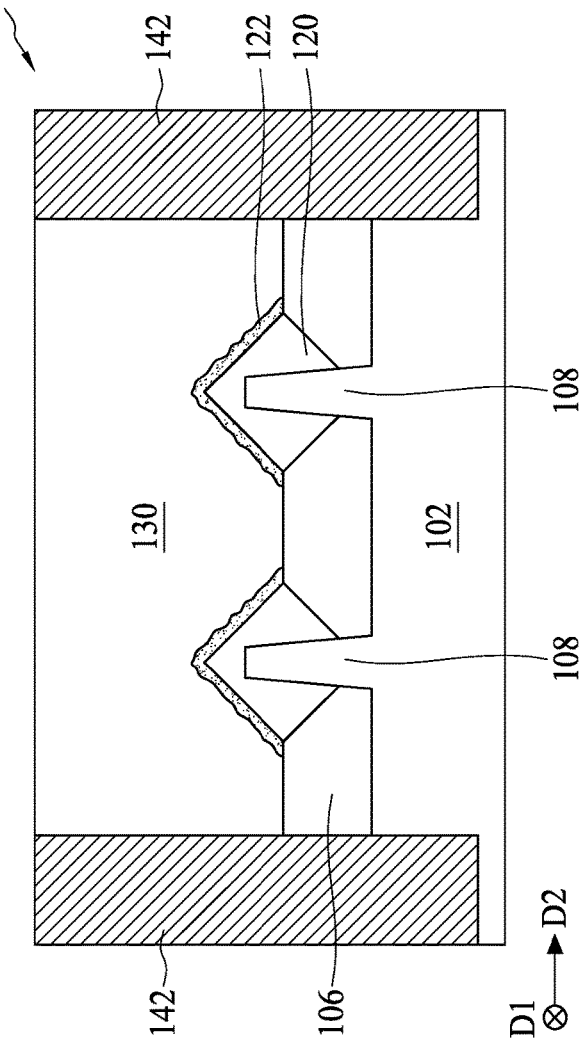
FIG. 2D is a schematic drawing illustrating a cross-sectional view of the semiconductor structure of FIG. 1 along line II-II' according to aspects of the present disclosure in one or more embodiments.
Figure 3B:
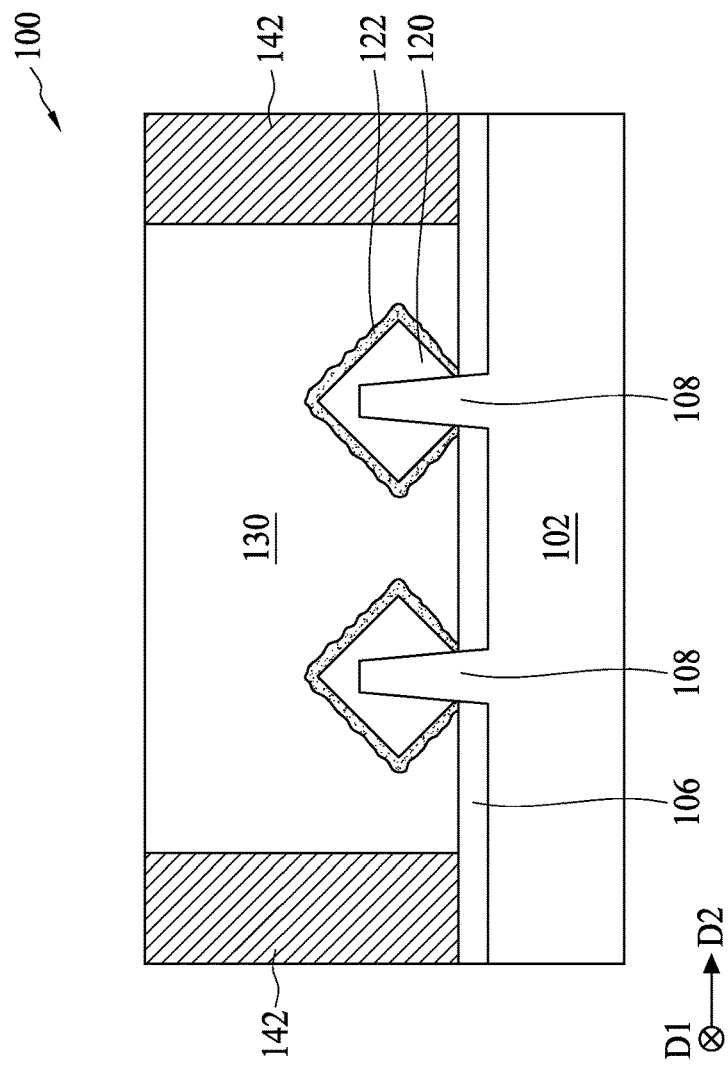
FIG. 3B is a schematic drawing illustrating a cross-sectional view of the semiconductor structure of FIG. 1 along line II-II' according to aspects of the present disclosure in one or more embodiments.
Figure 3A:
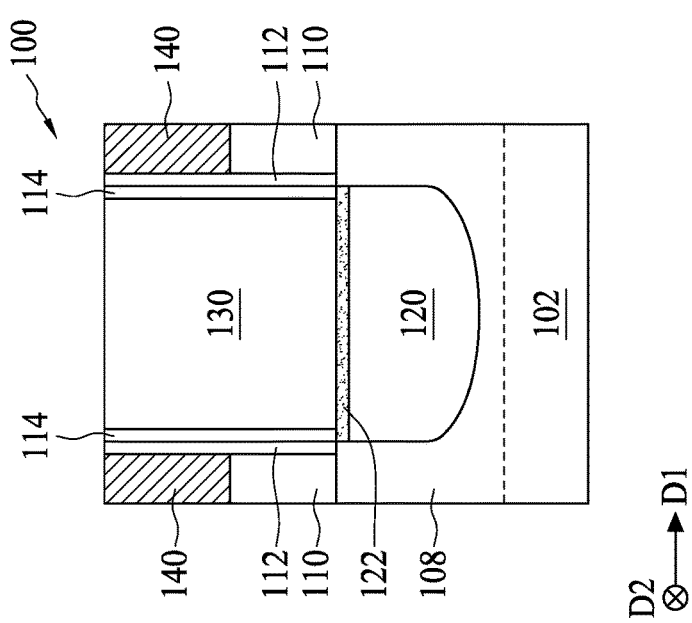
FIG. 3A is a schematic drawing illustrating a cross-sectional view of the semiconductor structure of FIG. 1 along line I-I' according to aspects of the present disclosure in one or more embodiments.
Figure 3C:
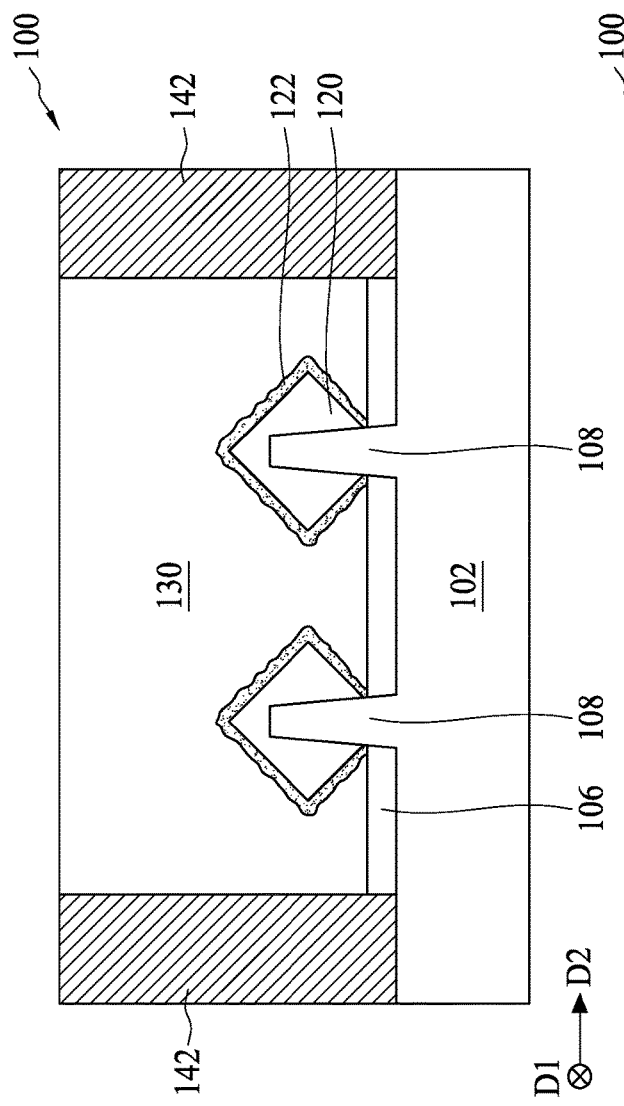
FIG. 3C is a schematic drawing illustrating a cross-sectional view of the semiconductor structure of FIG. 1 along line II-II' according to aspects of the present disclosure in one or more embodiments.
Figure 3D:
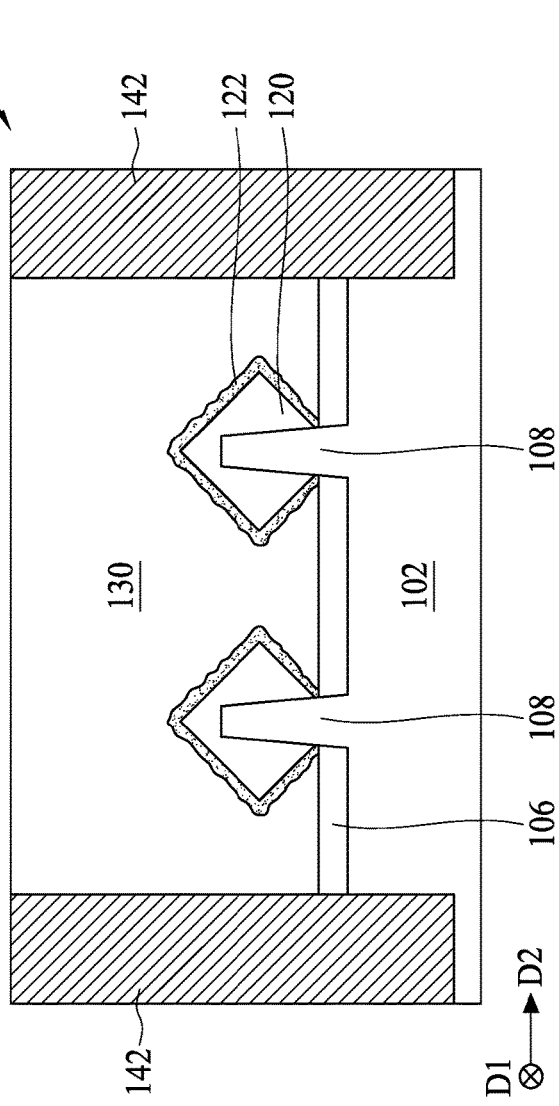
FIG. 3D is a schematic drawing illustrating a cross-sectional view of the semiconductor structure of FIG. 1 along line II-II' according to aspects of the present disclosure in one or more embodiments.

FIG. 1 is a schematic drawing illustrating a top view of a semiconductor structure 100 according to aspects of the present disclosure in one or more embodiments. In some embodiments, FIG. 1 may be a schematic drawing illustrating a layout structure of the semiconductor structure 100, but the disclosure is note limited thereto. FIG. 2A is a schematic drawing illustrating a cross-sectional view of the semiconductor structure of FIG. 1 along line I-I', and FIGS. 2B to 2D are schematic drawings illustrating cross-sectional views of the semiconductor structure of FIG. 1 along line II-II' according to aspects of the present disclosure in one or more embodiments. Further, FIG. 3A is a schematic drawing illustrating a cross-sectional view of the semiconductor structure of FIG. 1 along line I-I', and FIGS. 3B to 3D are schematic drawings illustrating cross-sectional views of the semiconductor structure of FIG. 1 along line II-II' according to aspects of the present disclosure in one or more embodiments. It should be noted that same elements in FIGS. 1 to 3D are indicated by same numerals, and can include a same material; thus, repeated detailed descriptions of such elements are omitted for brevity.

Referring to FIGS. 1 to 3D, the semiconductor structure 100 includes a substrate 102 (shown in FIGS. 2A to 3D). The substrate 102 may have different regions. For example, the substrate 102 may include a first region 104a and a second region 104b defined thereon. In some embodiments, the first region 104a may be a dense region and the second region 104b may be an iso region, but the disclosure is not limited thereto. The dense region has a pattern density greater than that of the iso region. In some embodiments, the regions 104a and 104b are defined for accommodating different devices. For example, the first region 104a may be defined to accommodate devices used to form memory cells, while the second region 104b may be defined to accommodate devices used to form a core circuit, a logic circuit, or an input/output (IO) circuit, but the disclosure is not limited thereto.

In some embodiments, the substrate 102 may be a semiconductor substrate such as a silicon substrate. The substrate 102 may also include other semiconductors such as germanium (Ge), silicon carbide (SiC), silicon germanium (SiGe), or diamond. Alternatively, the substrate 102 may include a compound semiconductor and/or an alloy semiconductor. The substrate 102 may include various layers, including conductive or insulating layers formed on a semiconductor substrate. The substrate 102 may include various doping configurations depending on design requirements as is known in the art. For example, different doping profiles (e.g., n wells or p wells) may be formed on the substrate 102 in regions 104a and 104b designed for different device types (e.g., n-type field effect transistors (NFET), or p-type field effect transistors (PFET)). The suitable doping may include ion implantation of dopants and/or diffusion processes. The substrate 102 typically includes isolation structures, e.g., shallow trench isolation (STI) structures 106, interposed between the regions 104a and 104b. In some embodiments, the STI structures 106 may separate fin structures from each other. Further, the substrate 102 may optionally include an epitaxial layer (epi-layer), may be strained for performance enhancement, may include an SOI structure, and may have other suitable enhancement features.

In some embodiments, the semiconductor structure 100 may include at least a FinFET device disposed in the first region 104a. In such embodiments, the semiconductor structure 100 includes at least a fin structure 108 and a gate structure 110 disposed over the substrate 102. As shown in FIGS. 1 to 3D the fin structure 108 extends in a direction D1, and the gate structure 110 extends in a direction D2 different from the direction D1. In some embodiments, the direction D1 and the direction D2 are perpendicular to each other, but the disclosure is not limited thereto. A portion of the fin structure 108 covered by the gate structure 110 serves as a channel region, and portions of the fin structure 108 exposed through the gate structure 110 serve as the source/drain structures.

In some embodiments, an epitaxial layer 120 may be formed over the fin structure 108, as shown in FIGS. 2A to 3D. The epitaxial layer 120 is formed on the portions of the fin structure 108 exposed through the gate structure 110 and serves as a part of the source/drain structures. In some embodiments, the FinFET device is an n-type fully-strained channel (NFSC) FinFET, and thus the epitaxial layer 120 may include silicon/carbon-doped silicon (Si/Si:C). As a result, electron mobility is improved by the fully-strained Si channel. In some alternative embodiments, the FinFET device may be a p-type fully-strained channel (PFSC) FinFET, and thus the epitaxial layer 120 may include silicon germanium. As a result, hole mobility is improved by the fully-strained SiGe channel.

In some embodiments, a silicide layer 122 may be formed on the epitaxial layer 120. In some embodiments, a coverage rate of the silicide layer 122 over the epitaxial layer 120 may be equal to or less than 50%, as shown in FIGS. 2A to 2D. In some embodiments, the coverage rate of the silicide layer 122 over the epitaxial layer 120 may be greater than 50%, as shown in FIGS. 3A to 3D.

The gate structure 110 may be a metal gate structure. The metal gate structure 110 may include at least a high-k gate dielectric layer, a work function metal layer, and a gap-filling metal layer, though not shown in FIGS. 1 to 3D. The high-k gate dielectric layer covers the fin structure 108. In some embodiments, the high-k gate dielectric layer includes a high-k dielectric material having a high dielectric constant, for example, greater than that of thermal silicon oxide (~3.9). The high-k gate dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfO_xN_y$), other suitable metal-oxides, or combinations thereof. Further, an interfacial layer (IL) (not shown) may be formed between the high-k gate dielectric layer and the fin structure. The IL may include an oxide-containing material such as SiO or SiON. In some embodiments, the metal gate structure may further include at least a barrier metal layer (not shown). The barrier metal layer can include, for example but not limited thereto, TiN. For the n-type FinFET device, one or more of TaAl, TiAlC, TiAl(Si)C, TaAlC and TaSiAlC can be used as the work function metal layer. For the p-type FinFET device, one or more of TaN, TiN, TSN, Mo and WCN can be used as the work function metal layer. Further, the work function metal layer can include a single layer or a multilayer of two or more of these materials, but is not limited thereto.

The semiconductor structure 100 further includes a connecting structure 130 disposed over the fin structure 108. As shown in FIG. 1, the connecting structure 130 may have different sizes in one region and/or in different regions. For example, a size of the connecting structure 130 in the second region 104b (i.e., the iso region) may be greater than sizes of the connecting structures 130 in the first region 104a (i.e., the dense region). Further, the sizes of the connecting structures 130 in the first region 104a may be different, depending on the circuit designs. The connecting structure 130 may include conductive material, such as metals. In some embodiments, the connecting structure 130 has a consistent width, as shown in FIGS. 2A to 3B.

As shown in FIGS. 2A to 3D, in some embodiments, the connecting structure 130 is in contact with the silicide layer 122. Thus, the connecting structure 130 is electrically connected to the source/drain structure through the silicide layer 122, and a contact resistance between the connecting structure 130 and the source/drain structure may be reduced by the silicide layer 122. In some embodiments, the connecting structure 130 is separated from the gate structure 110, as shown in FIGS. 2A and 3A. In some embodiments, the connecting structure 130 is separated from the gate structure 110 by a spacer 112 and a contact etch stop layer (CESL) 114 disposed over sidewalls of the gate structure 110. Additionally, the CESL 114 may be referred to as a bottom etch stop layer (BESL).

In some embodiments, the semiconductor structure 100 includes at least a first dielectric structure 140 disposed over the gate structure 110. Further, the first dielectric structure 140 may be disposed over the spacer 112, as shown in FIGS. 2A to 2D. In some embodiments, the semiconductor structure 100 includes at least a second dielectric structure 142 disposed over the substrate 102. Further, the second dielectric structure 142 extends in the direction D1. Thus, the connecting structures 130 may be separated from each other in the direction D2, as shown in FIG. 1. In some embodiments, the CESL 114 and the second dielectric structure 142 may be coupled to each other to form a grid, as shown in FIG. 1, but the disclosure is not limited thereto.

A depth of the second dielectric structure 142 may be different depending on different process and product designs. For example, in some embodiments, a bottom of the second dielectric structure 142 may be in contact with the isolation structure 106 and separated from the substrate 102 by the isolation structure 106. Further, sidewalls of the second dielectric structure 142 may be entirely in contact with the connecting structure 130, as shown in FIGS. 2B and 3B. In some embodiments, a bottom of the second dielectric structure 142 may be in contact with the substrate 102, while the sidewalls of the second dielectric structure 142 are in contact with both the connecting structure 130 and the isolation structure 106, as shown in FIGS. 2C and 3C. In some embodiments, the bottom of the second dielectric structure 142 may is in contact with the substrate 102, while the sidewalls of the second dielectric structure 142 are in contact with the substrate 102, the isolation structure 106 and the connecting structure 130, as shown in FIGS. 2D and 3D.

In some embodiments, the CESL 114, the first dielectric structure 140 and the second dielectric structure 142 include a same material. In some embodiments, the CESL 114, the first dielectric structure 140 and the second dielectric structure 142 may include silicon nitride. In some embodiments, the CESL 114, the first dielectric structure 140 and the second dielectric structure 142 may include low-k material, such that capacitance between the connecting structures 130 may be reduced. Further, a top surface of the first dielectric structure 140 and a top surface of the second dielectric structure 142 are substantially aligned with (i.e., coplanar with) each other. In some embodiments, the semiconductor structure 100 provides an enclosing dielectric structure formed by at least the first and second dielectric structures 140 and 142 surrounding the connecting structure 130 from a top view.

Referring to FIG. 1, in some embodiments, the semiconductor structure 100 may further include a guardrail 144 disposed over the substrate 102. The guardrail 144 may surround the first dielectric structures 140, the second dielectric structures 142, and the connecting structure 130. Further, the guardrail 144 may be coupled to the first and second dielectric structures 140 and 142. The guardrail 144 may include a material that is same as that of the first and second dielectric structures 140 and 142. In some embodiments, a top surface of the guardrail 144 may be substantially aligned with (i.e., coplanar with) the top surface of the first dielectric structure 140 and the top surface of the second dielectric structure 142.

In some embodiments, the semiconductor structure 100 further includes a third dielectric structure 150 disposed over the substrate 102. The third dielectric structure 150 includes a material different from that of the first dielectric structure 140 and the second dielectric structure 142. For example, the third dielectric structure 150 may include silicon oxide, but the disclosure is not limited thereto. In some embodiments, a top surface of the third dielectric structure 150 is substantially aligned with (i.e., coplanar with) the top surface of the first dielectric structure 140 and the top surface of the second dielectric structure 142.

Figure 4:
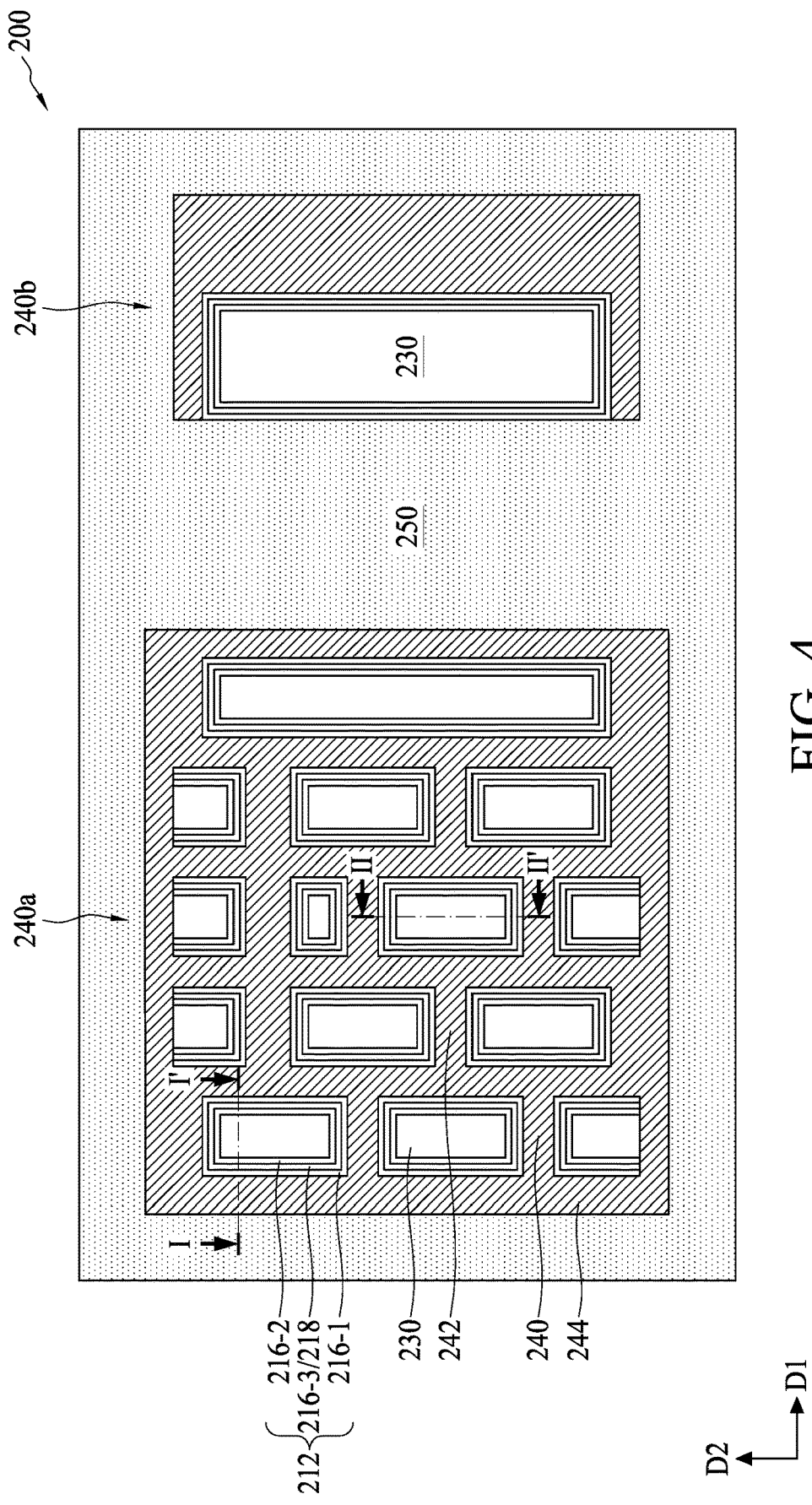
FIG. 4 is a schematic drawing illustrating a top view of a semiconductor structure according to aspects of the present disclosure in one or more embodiments.

FIG. 4 is a schematic drawing illustrating a top view of a semiconductor structure 200 according to aspects of the present disclosure in one or more embodiments. In some embodiments, FIG. 4 may be a schematic drawing illustrating a layout structure of the semiconductor structure 200, but the disclosure is note limited thereto. FIG. 5A is a schematic drawing illustrating a cross-sectional view of the semiconductor structure of FIG. 4 along line I-I', and FIG. 5B is a schematic drawing illustrating a cross-sectional view of the semiconductor structure of FIG. 1 along line II-II' according to aspects of the present disclosure in one or more embodiments. It should be noted that same elements in FIGS. 1 to 5B are indicated by same numerals, and can include a same material; thus, repeated detailed descriptions of such elements are omitted for brevity.

Referring to FIGS. 4 to 5B, the semiconductor structure 200 includes a substrate 202. The substrate 202 may have different regions. For example, the substrate may include a first region 204a and a second region 204b defined thereon. As mentioned above, the first region 204a may be a dense region and the second region 204b may be an iso region, but the disclosure is not limited thereto. In some embodiments, the regions 204a and 204b are defined for accommodating different devices. The substrate 202 may include various doping configurations depending on design requirements as is known in the art. The substrate 202 typically has isolation structures, e.g., STI structures 206, interposed between the regions 204a and 204b. In some embodiments, the STI structures 206 may separate fin structures from each other. Further, the substrate 202 may optionally include an epitaxial layer (epi-layer), may be strained for performance enhancement, may include an SOI structure, and may have other suitable enhancement features.

In some embodiments, the semiconductor structure 200 may include at least a FinFET device disposed in the first region 204a. In such embodiments, the semiconductor structure includes at least a fin structure 208 and a gate structure 210 disposed over the substrate 202. As shown in FIGS. 4 to 5B, the fin structure 208 extends in a direction D1, and the gate structure 210 extends in a direction D2 different from the direction D1. In some embodiments, direction D1 and the direction D2 are perpendicular to each other, but the disclosure is not limited thereto. A portion of the fin structure 208 covered by the gate structure 210 serves as a channel region, and portions of the fin structure 208 exposed through the gate structure 210 serve as the source/drain structures. In some embodiments, an epitaxial layer 220 may be formed over the fin structure 208, as shown in FIGS. 5A and 5B. The epitaxial layer 220 is formed on the portions of the fin structure 208 exposed through the gate structure 210 and serves as a part of the source/drain structures. In some embodiments, a silicide layer 222 may be formed on the epitaxial layer 220. In some embodiments, a coverage rate of the silicide layer 222 over the epitaxial layer 220 may be equal to or less than 50%, though not shown. In some embodiments, the coverage rate of the silicide layer 222 over the epitaxial layer 220 may be greater than 50%, as shown in FIGS. 5A and 5B.

The gate structure 210 may be a metal gate structure. The metal gate structure may include at least a high-k gate dielectric layer, a work function metal layer, and a gap-filling metal layer, though not shown in FIGS. 4 to 5B.

The semiconductor structure 200 further includes a connecting structure 230 disposed over the fin structure 208. As shown in FIG. 4, the connecting structure 230 may have different sizes in one region and/or in different regions. For example, a size of the connecting structure 230 in the second region 204b (i.e., the iso region) may be greater than sizes of the connecting structures 230 in the first region 204b (i.e., the dense region). Further, the sizes of the connecting structures 230 in the first region 104b may be different, depending on the circuit designs. The connecting structure 230 may include conductive material, such as metals. In some embodiments, the connecting structure 230 has a consistent width, as shown in FIGS. 5A and 5B.

As shown in FIGS. 5A and 5B, in some embodiments, the connecting structure 230 is in contact with the silicide layer 222. Thus, the connecting structure 230 is electrically connected to the source/drain structure through the silicide layer 222, and a contact resistance between the connecting structure 230 and the source/drain structure may be reduced by the silicide layer 222. In some embodiments, the connecting structure 230 is separated from the gate structure 210, as shown in FIG. 5A. In some embodiments, the connecting structure 230 is separated from the gate structure 210 by a spacer 212 disposed over sidewalls of the gate structure 210.

In some embodiments, the spacer 212 includes a hybrid structure. For example, the spacer 212 may include a solid spacer 214 and an air spacer 218 sealed within the solid spacer 214. In some embodiments, the solid spacer 214 may include a first vertical portion 216-1, a second vertical portion 212 and a sealing portion 216-3. As shown in FIG. 5A, the first vertical portion 216-1 may be in contact with the connecting structure 230, and the second vertical portion 212 may be in contact with the gate structure 210. Further, the sealing portion 216-3 may be formed to seal a gap between the first and second vertical portions 216-1 and 212. Consequently, the air spacer 218 is formed between the first vertical portion 216-1, the second vertical portion 212 and the sealing portion 216-3. In some embodiments, the first vertical portion 216-1 and the second vertical portion 212 may include a same material. In some embodiments, the sealing portion 218 may include a material different from that of the first and second vertical portions 216-1 and 212, but the disclosure is not limited thereto. In some alternative embodiments, the sealing portion 218 may include a material the same as that of the first and second vertical portions 216-1 and 212.

In some embodiments, the semiconductor structure 200 includes at least a first dielectric structure 240 disposed over the gate structure 210. Further, the first dielectric structure 240 may be disposed adjacent to the spacer 212, as shown in FIG. 5A. In some embodiments, the semiconductor structure 200 includes at least a second dielectric structure 242 disposed over the substrate 202. Further, the second dielectric structure 242 extends in the direction D1. Thus, the connecting structures 230 may be separated from each other in the direction D2, as shown in FIG. 4. In some embodiments, the vertical version 216-2 and the second dielectric structure 242 may be coupled to each other to form a grid, as shown in FIG. 4, but the disclosure is not limited thereto.

As mentioned above, the first dielectric structure 240 and the second dielectric structure 242 include a same material. In some embodiments, a top surface of the first dielectric structure 240 and a top surface of the second dielectric structure 242 are substantially aligned with (i.e., coplanar with) each other. Additionally, a top surface of the spacer 212 (i.e., a top surface of the solid spacer 214) is aligned with the top surfaces of the first and second dielectric structures 240 and 242. In some embodiments, the semiconductor structure 200 provides an all-around dielectric structure formed by at least the first and second dielectric structures 240 and 242 surrounding the connecting structure 230 from a top view.

Referring to FIG. 4, in some embodiments, the semiconductor structure 200 may further include a guardrail 244 disposed over the substrate 202. The guardrail 244 may surround the first dielectric structures 240, the second dielectric structures 242, and the connecting structure 230. Further, the guardrail 244 may be coupled to the first and second dielectric structures 240 and 242. The guardrail 244 may include a material the same as that of the first and second dielectric structures 240 and 242. In some embodiments, a top surface of the guardrail 244 may be substantially aligned with (i.e., coplanar with) the top surfaces of the first and second dielectric structures 240 and 242.

Figure 6:
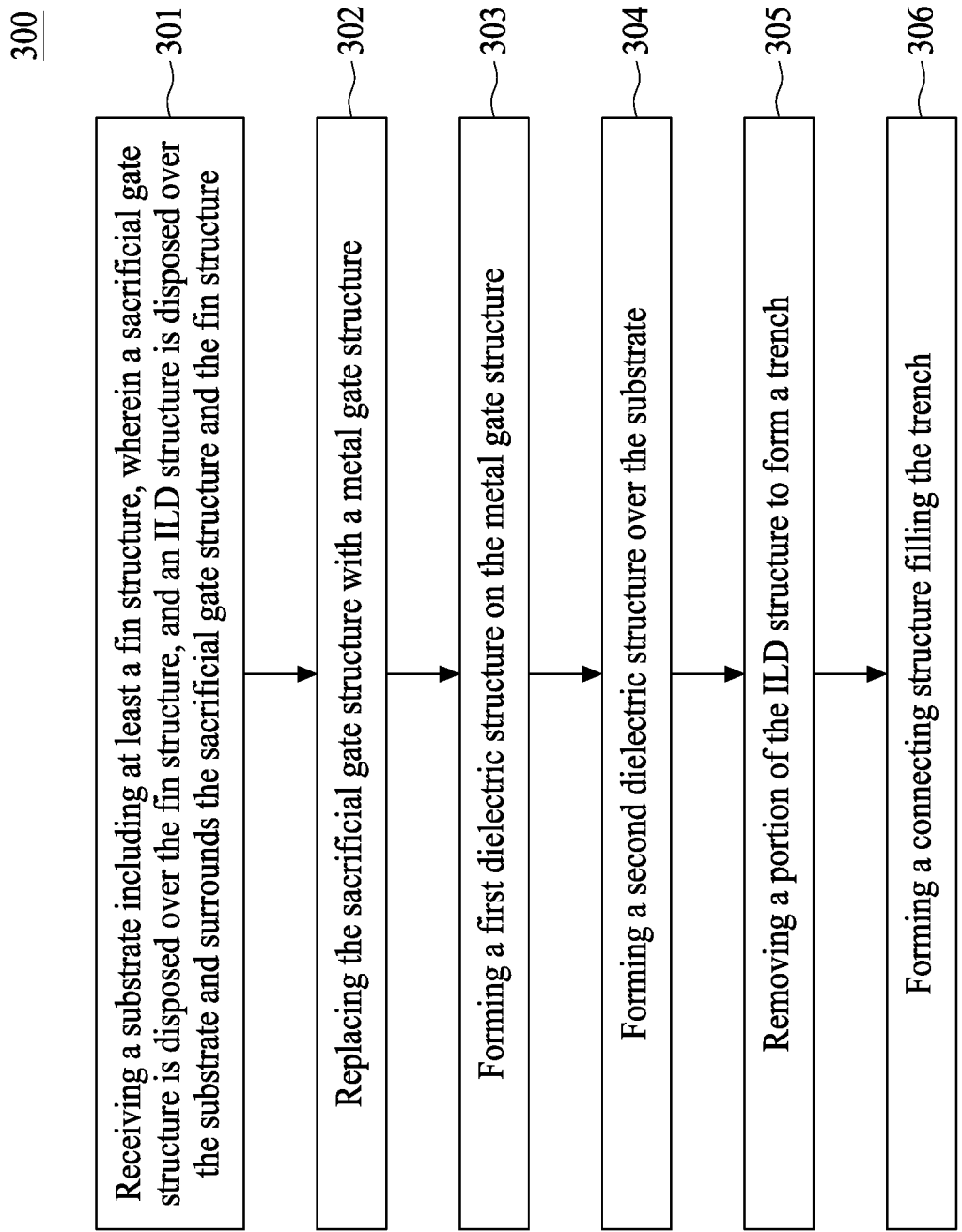
FIG. 6 is a flowchart of a method for forming a semiconductor structure according to aspects of the present disclosure in one or more embodiments.

FIG. 6 is a flowchart of a method for forming a semiconductor structure 300 according to aspects of the present disclosure in one or more embodiments. The method for forming the semiconductor structure 300 includes a number of operations (301, 302, 303, 304, 305 and 306) and is further described below according to one or more embodiments. It should be noted that the operations of the method 300 may be omitted, rearranged or otherwise modified within the scope of the various aspects. It should further be noted that additional operations may be provided before, during, and after the method 300, and that some other operations may be only briefly described herein. Thus other implementations are possible within the scope of the various aspects described herein. FIGS. 7A to 14C are schematic drawings illustrating a semiconductor structure at various stages in a method for forming a semiconductor structure according to aspects of one or more embodiments of the present disclosure. It should be noted that same elements in FIGS. 1 to 14C can include a same material; thus, repeated detailed descriptions of such elements are omitted for brevity.

Referring to FIGS. 7A to 7C, in some embodiments, a substrate 102 is received in operation 301. In some embodiments, the substrate 102 may be defined as including a first region 104a and a second region 104b, as shown in FIG. 7A. The different regions 104a and 104b may be defined to accommodate devices of different sizes. At least a fin structure 108 is formed over the substrate 102. As mentioned above, an isolation structure 106 may be formed over the substrate 102 to separate different devices and fin structures 108. A sacrificial gate structure 109 is formed over the fin structure 108. As mentioned above, the sacrificial gate structure 109 covers portions of the fin structure 108 and exposes portions of the fin structure 108. In some embodiments, spacers 112 may be formed over sidewalls of the sacrificial gate structure 109. In some embodiments, the spacers 112 are made of silicon nitride (SiN), silicon carbide (SiC), SiO, silicon oxynitride (SiON), silicon carbon or any suitable material, but the disclosure is not limited thereto. In some embodiments, the spacers 112 are formed by deposition and etch-back operations.

Next, source/drain structures are formed over the fin structure 108 at two opposite sides of the sacrificial gate structure 109 in accordance with some embodiments. In some embodiments, the source/drain structures includes the portion of the fin structure 108 exposed through the sacrificial gate structure 109 and an epitaxial layer 120. In some embodiments, the source/drain structures can be taller than a height of the portion of the fin structures 108 covered by the sacrificial gate structure 109. In some embodiments, the epitaxial layer 120 may be formed by forming recesses in the fin structure 108 and growing a strained material in the recesses by an epitaxial (epi) process. In addition, the lattice constant of the strained material may be different from the lattice constant of the fin structure 108. Accordingly, the source/drain structures serve as stressors that improve carrier mobility.

Still referring to FIGS. 7A to 7C, after the forming of the source/drain structures, a contact etch stop layer (CESL) 124 may be formed to cover the sacrificial gate structures 109 over the substrate 102. In some embodiments, the CESL 124 can include silicon nitride, silicon oxynitride, and/or other applicable materials. Subsequently, an inter-layer dielectric (ILD) structure 150 may be formed on the CESL 124 over the substrate 102. The ILD structure 150 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), and polyimide. Next, a polishing process is performed on the ILD structure 150 and the CESL 124 to expose top surfaces of the sacrificial gate structure 109. In some embodiments, the ILD structure 150 and the CESL 124 are planarized by a chemical mechanical polishing (CMP) process until the top surfaces of the sacrificial gate structure 109 are exposed. Consequently, the ILD structure 150 surrounds the sacrificial gate structure 109 and the fin structure 108.

Figure 8B:
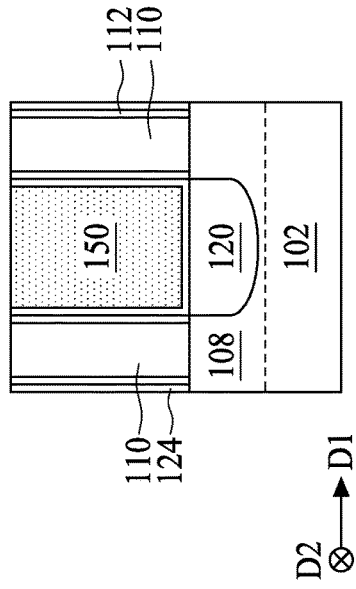
FIG. 8B is a schematic drawing illustrating a cross-sectional view of the semiconductor structure of FIG. 8A along line I-I'.
Figure 8C:
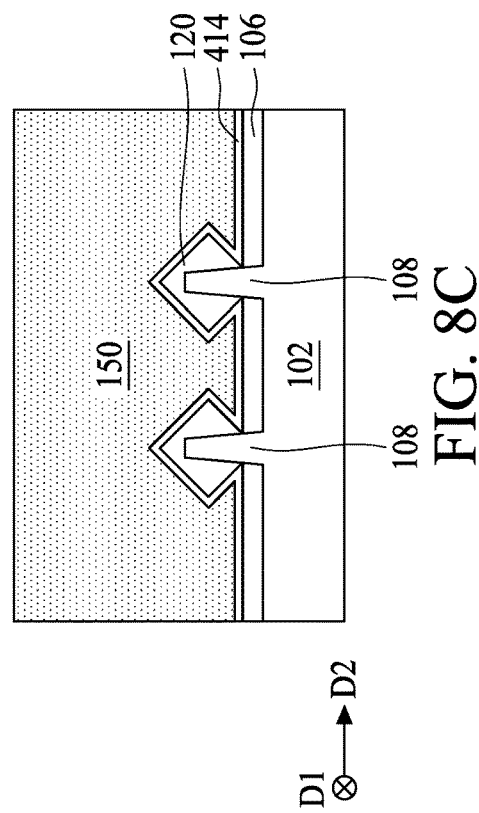
FIG. 8C is a schematic drawing illustrating a cross-sectional view of the semiconductor structure of FIG. 8A along line II-II'.
Figure 8A:
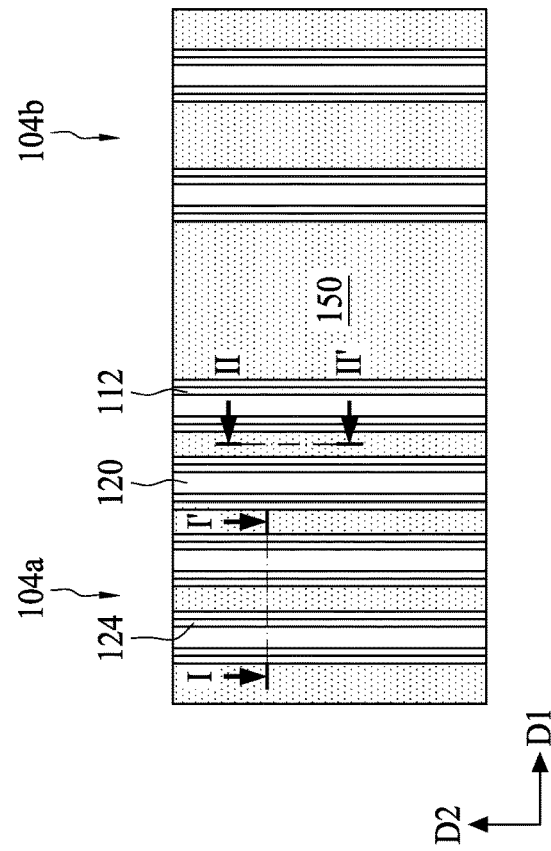
FIG. 8A is a schematic drawing illustrating a schematic top view of a semiconductor structure at a stage subsequent to that of FIG. 7A.
Figure 9B:
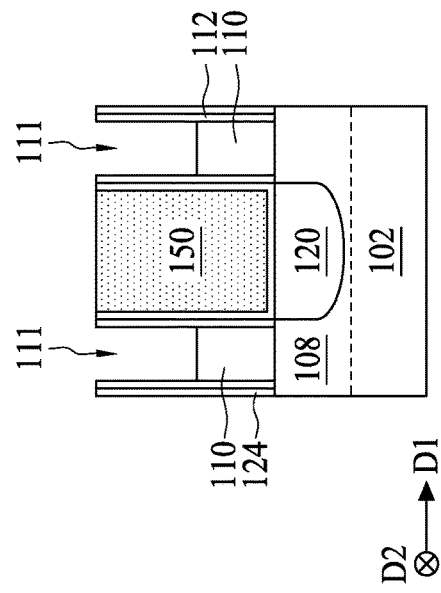
FIG. 9B is a schematic drawing illustrating a cross-sectional view of the semiconductor structure of FIG. 9A along line I-I'.
Figure 9C:
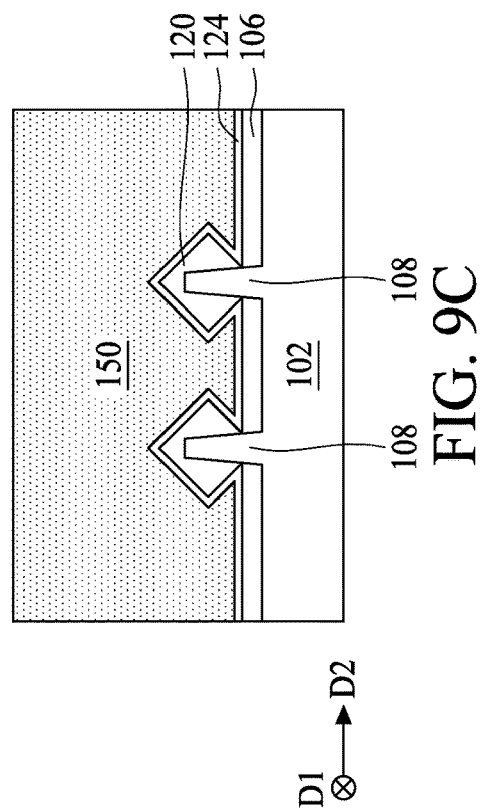
FIG. 9C is a schematic drawing illustrating a cross-sectional view of the semiconductor structure of FIG. 9A along line II-II'.
Figure 9A:
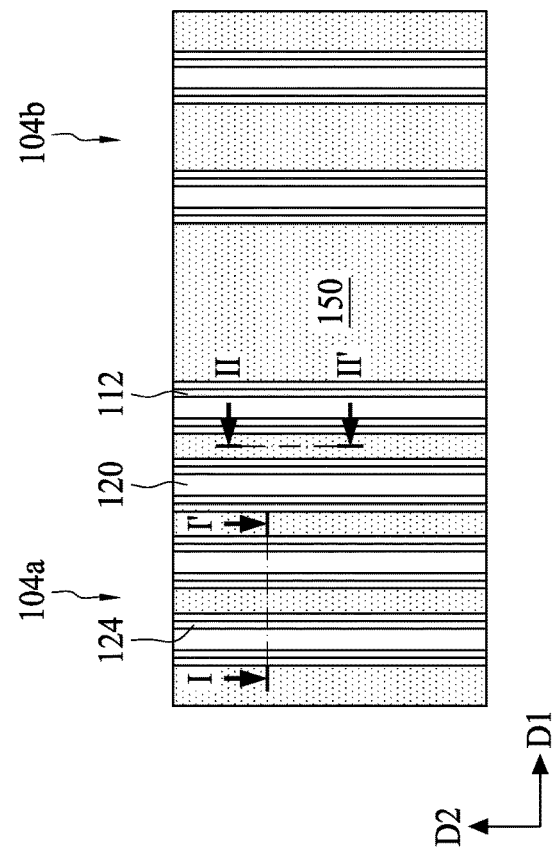
FIG. 9A is a schematic drawing illustrating a schematic top view of a semiconductor structure at a stage subsequent to that of FIG. 8A.

Referring to FIGS. 8A to 8C, in some embodiments, the sacrificial gate structure 109 is replaced with a metal gate structure 110 in operation 302. In some embodiments, after the exposing of the top surfaces of the sacrificial gate structures 109, the sacrificial gate structure 109 is removed to form a gate trench (not shown). Accordingly, the fin structure 108 is exposed through the gate trench. In some embodiments, by adjusting a width of the fin structure 108 exposed through the gate trench, Vt of the FinFET device to be formed can be adjusted to meet requirements.

In some embodiments, an IL layer (not shown) is formed to cover the fin structure 108 exposed through the gate trench. A high-k gate dielectric layer (not shown) is formed over the fin structure 108, and a work function metal layer (not shown) is formed on the high-k gate dielectric layer. The work function metal layer may include n-type metal material or p-type metal material, as mentioned above. Further, by selecting material and adjusting a thickness of the work function metal layer, Vt of the FinFET device may be further adjusted to meet requirements. After the forming of the work function metal layer, a gap-filling metal layer (not shown) is formed to fill the gate trench. Accordingly, the metal gate structure 110 including the IL layer, the high-k dielectric layer, the work function metal layer and the gap-filling metal layer is obtained, as shown in FIGS. 8A to 8C.

Referring to FIGS. 9A to 10C, in some embodiments, a first dielectric structure 140 is formed on the metal gate structure 110 in operation 303. In some embodiments, a portion of the metal gate structure 110 is removed to form at least a recess 111, as shown in FIG. 9B. In some embodiments, the removal of the potion of the metal gate structure 110 includes a dry etch. In some embodiments, a boron trichloride ($BCl_3$) plasma may be used in the dry etch, but the disclosure is not limited thereto. In some embodiments, the spacer 112 is exposed through sidewalls of the recess 111, and the metal gate structure 110 is exposed through a bottom of the recess 111.

Figure 10B:
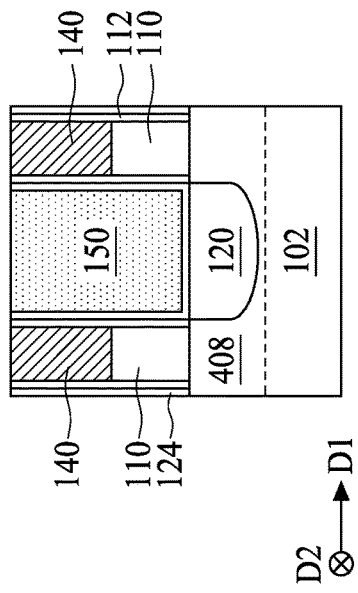
FIG. 10B is a schematic drawing illustrating a cross-sectional view of the semiconductor structure of FIG. 10A along line I-I'.
Figure 10C:
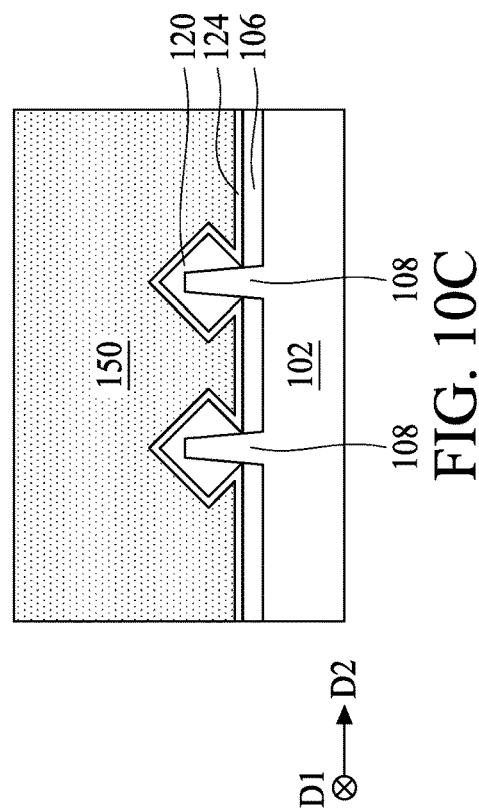
FIG. 10C is a schematic drawing illustrating a cross-sectional view of the semiconductor structure of FIG. 10A along line II-II'.
Figure 10A:
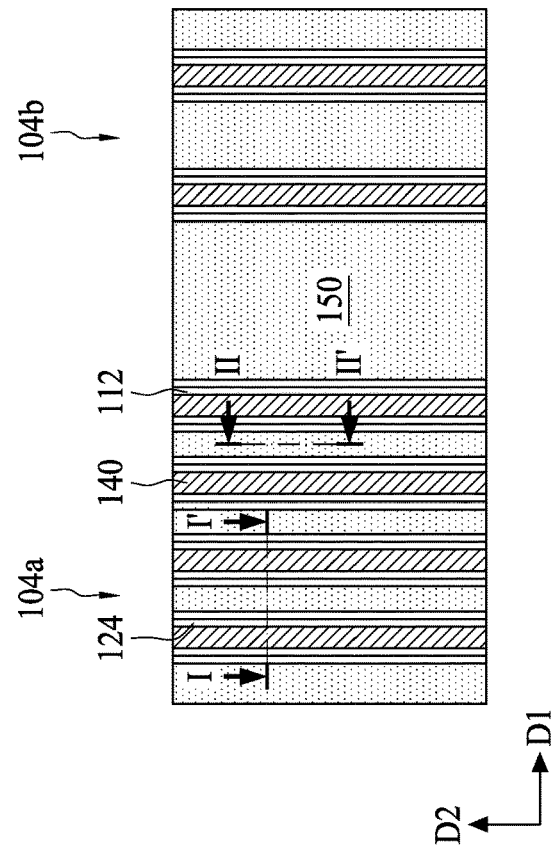
FIG. 10A is a schematic drawing illustrating a schematic top view of a semiconductor structure at a stage subsequent to that of FIG. 9A.

Referring to FIGS. 10A to 10C, the first dielectric structure 140 is formed in the recess 111. In some embodiments, a dielectric material is formed to fill the recess 111. Subsequently, a planarization operation such as a CMP is performed to remove superfluous dielectric material. Accordingly, the first dielectric structure 140 is obtained, as shown in FIGS. 10A and 10B. It should be noted that the dielectric material used to form the first dielectric structure 140 is different from that of the ILD structure 150. In some embodiments, the ILD structure 150 may include silicon oxide, and the first dielectric structure 140 may include silicon nitride, silicon oxynitride (SiON) or low-k materials, but the disclosure is not limited thereto. In some embodiments, a top surface of the first dielectric structure 140 is substantially aligned with (i.e., coplanar with) a top surface of the ILD structure 150. Further, sidewalls of the first dielectric structure 140 are in contact with the spacer 112, and a bottom of the first dielectric structure 140 is in contact with the metal gate structure 110. As shown in FIG. 10A, because the first dielectric structure 140 is formed over the metal gate structure 110, the first dielectric structure 140 extends in the direction D2.

Figure 11B:
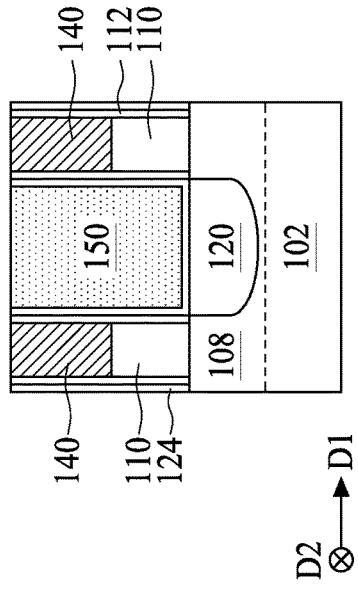
FIG. 11B is a schematic drawing illustrating a cross-sectional view of the semiconductor structure of FIG. 11A along line I-I'.
Figure 11C:
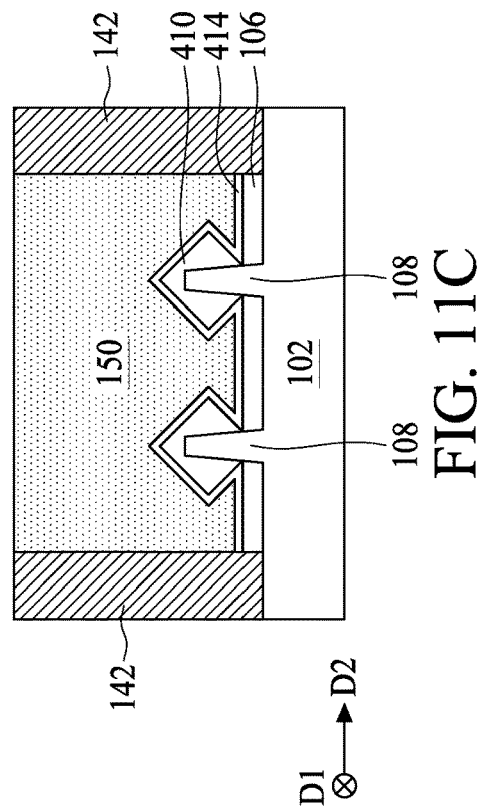
FIG. 11C is a schematic drawing illustrating a cross-sectional view of the semiconductor structure of FIG. 11A along line II-II'.
Figure 11A:
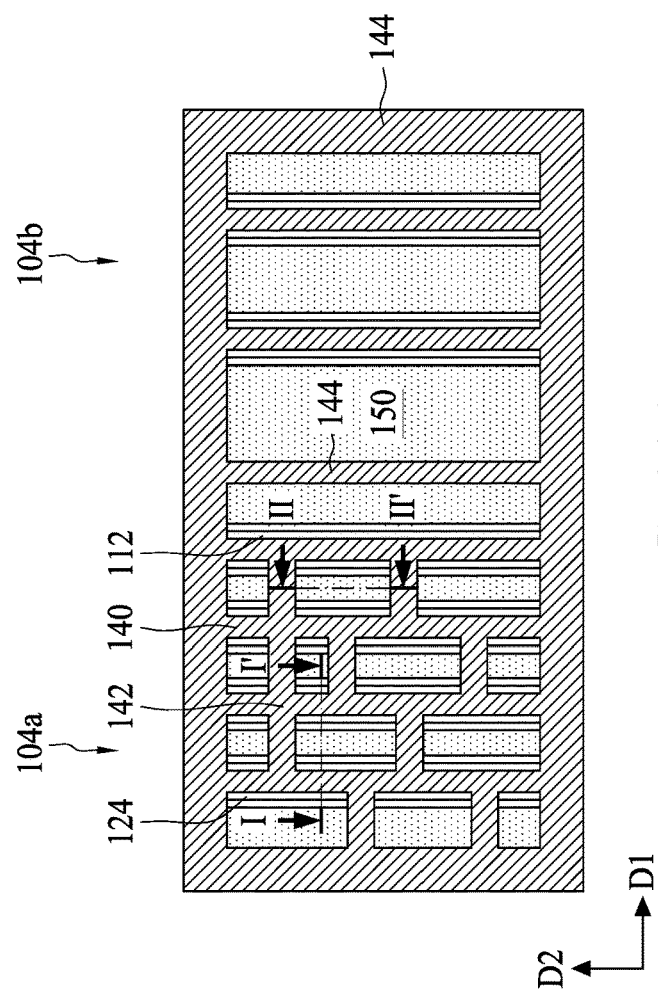
FIG. 11A is a schematic drawing illustrating a schematic top view of a semiconductor structure at a stage subsequent to that of FIG. 10A.

In some embodiments, a second dielectric structure 142 is formed over the substrate 102 in operation 304. In some embodiments, a patterning operation may be performed to remove portions of the ILD structure 150 to form at least a recess (not shown). In such embodiments, the ILD structure 150 is exposed through sidewalls of the recess, and the substrate 102 is exposed through a bottom of the recess. Subsequently, a dielectric material, such as silicon nitride, is formed to fill the recess, and a planarization operation such as a CMP is performed to remove superfluous dielectric material. Accordingly, at least a second dielectric structure 142 is formed over the substrate 102. In some embodiments, the second dielectric structure 142 extends in the direction D1. Thus, the first dielectric structure 140 and the second dielectric structure 142 extend in different directions, as shown in FIG. 11A. As mentioned above, the second dielectric structure 142 includes a material that is same as that of the first dielectric structure 140. In some embodiments, sidewalls of the second dielectric structure 142 are in contact with the ILD structure 150. Additionally, the sidewalls of the second dielectric structure 142 may be in contact with the isolation structure 406 and the CESL 124. In some embodiments, the top surface of the first dielectric structure 140, a top surface of the second dielectric structure 142 and the top surface of the ILD structure 150 are substantially aligned with each other.

In some embodiments, a guardrail 144 may be formed simultaneously with the forming of the second dielectric structure 142. In such embodiments, the guardrail 144 may include a material that is same as that of the first and second dielectric structures 140 and 142. As shown in FIG. 11A, in some embodiments, the guardrail 144 surrounds the first and second dielectric structures 140 and 142. Further, the guardrail 144 is coupled to the first and second dielectric structures 140 and 142. Additionally, a portion of the guardrail 144 may be formed between the first region 104a and the second region 104b, but the disclosure is not limited thereto. In some embodiments, the first dielectric structure 140, the second dielectric structure 142 and the guardrail 144 form a grid, as shown in FIG. 11A, but the disclosure is not limited thereto.

Figure 12B:
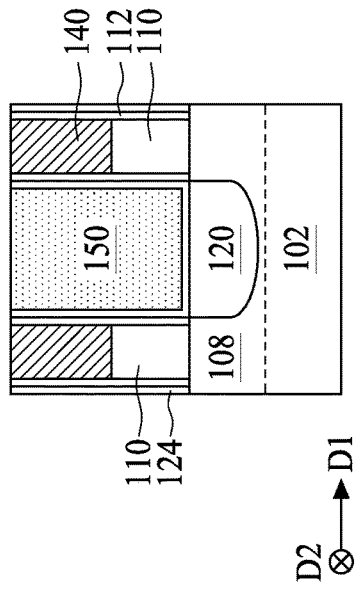
FIG. 12B is a schematic drawing illustrating a cross-sectional view of the semiconductor structure of FIG. 12A along line I-I'.
Figure 12C:
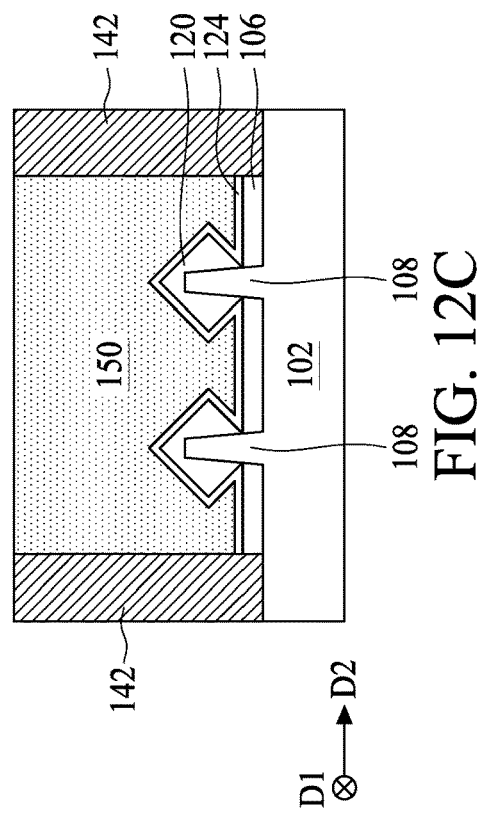
FIG. 12C is a schematic drawing illustrating a cross-sectional view of the semiconductor structure of FIG. 12A along line II-II'.
Figure 12A:
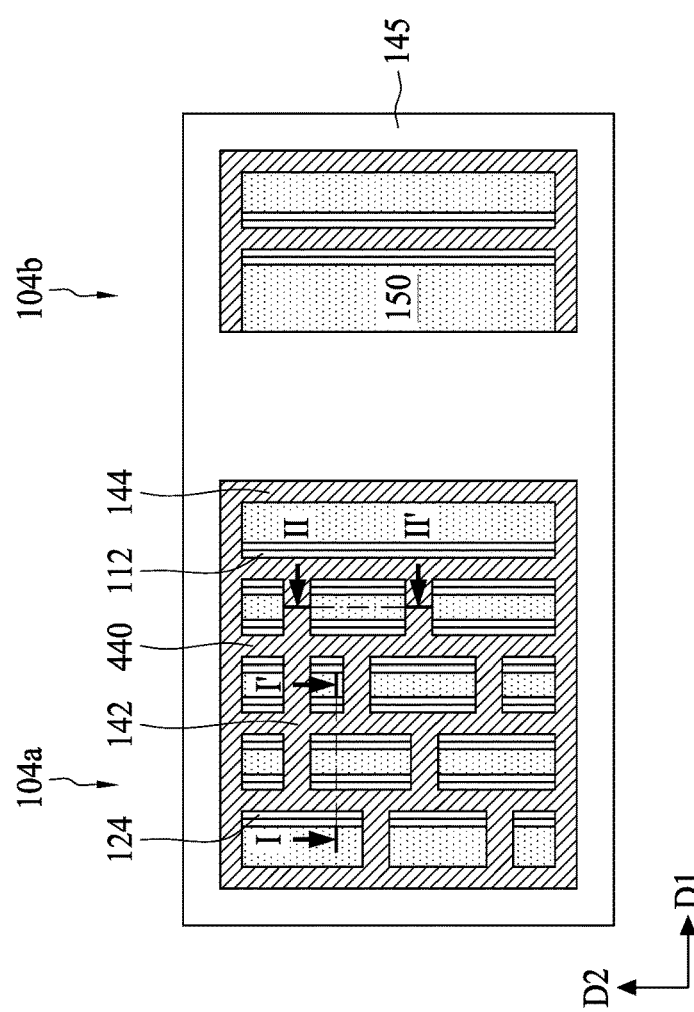
FIG. 12A is a schematic drawing illustrating a schematic top view of a semiconductor structure at a stage subsequent to that of FIG. 11A.

In some embodiments, a portion of the ILD structure 150 is removed to form a trench 151 exposing a portion of the fin structure 108 in operation 305. Referring to FIGS. 12A to 12C, in some embodiments, a patterned hard mask 145 is formed over the ILD structure 150, the first dielectric structure 140, the second dielectric structure 142 and the guardrail 144. In some embodiments, the patterned hard mask 145 is a single-layered structure. In some alternative embodiments, the patterned hard mask 145 is a multi-layered structure. In such embodiments, the patterned hard mask 145 may include a tungsten carbide (WC) layer and a silicon oxide layer, but the disclosure is not limited thereto.

Figure 13B:
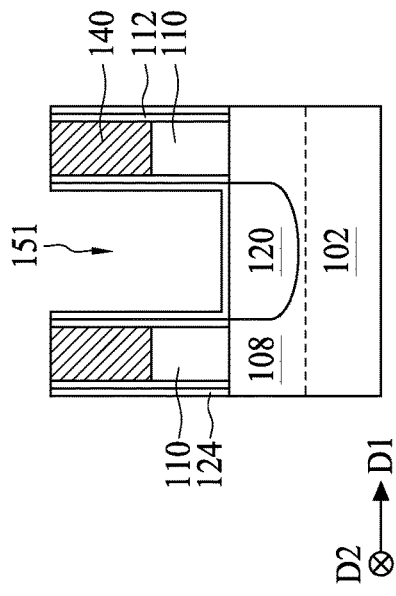
FIG. 13B is a schematic drawing illustrating a cross-sectional view of the semiconductor structure of FIG. 13A along line I-I'.
Figure 13C:
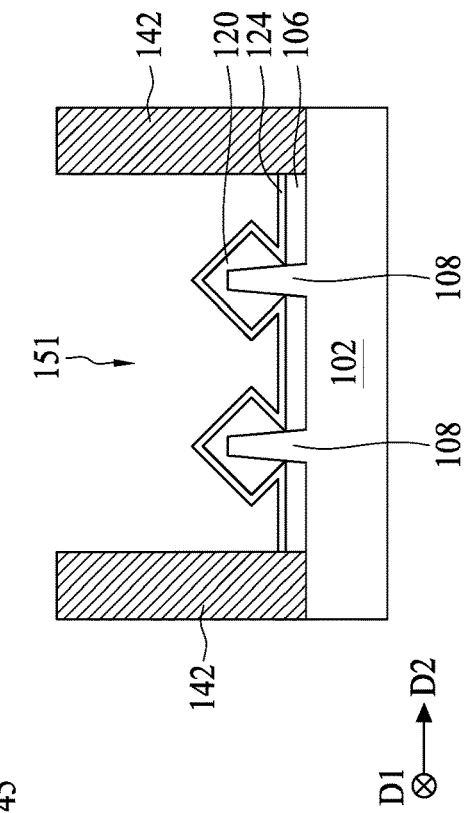
FIG. 13C is a schematic drawing illustrating a cross-sectional view of the semiconductor structure of FIG. 13A along line II-II'.
Figure 13A:
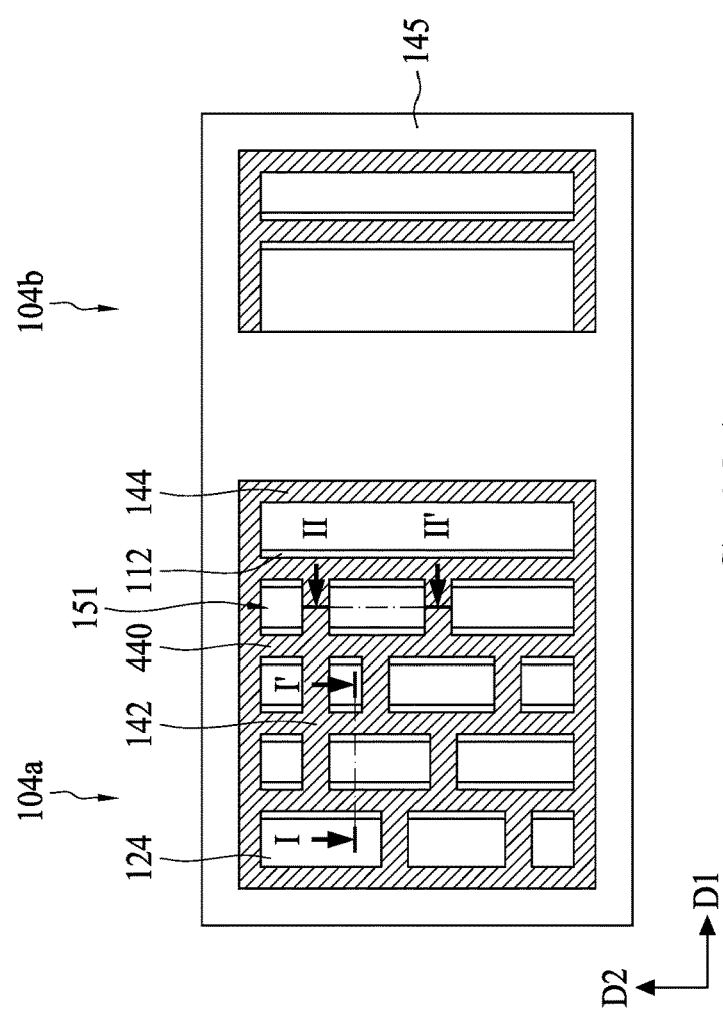
FIG. 13A is a schematic drawing illustrating a schematic top view of a semiconductor structure at a stage subsequent to that of FIG. 12A.

Referring to FIGS. 13A to 13C, in some embodiments, portions of the ILD structure 150 exposed through the patterned hard mask 145 are removed to form the trenches 151. In some embodiments, the trenches 151 are defined by the grid formed of the CESL 124, the first dielectric structure 140, the second dielectric structure 142 and the guardrail 144. In some embodiments, an isotropic etching is performed to remove the portions of the ILD structure 150. In some embodiments, the isotropic etch may include a dry etch to remove the portions of the ILD structure 150. In such embodiments, a $C_4F_6/O_2$ plasma may be used in the dry etch. In some embodiments, a $C_4F_8/O_2$ plasma may be used in the dry etch. In some embodiments, the isotropic etch includes a wet etch. In such embodiments, a diluted hydrofluoric acid (dHF) or a vapor HF may be used in the wet etch. In some embodiments, the isotropic etch may include a chemical etch. In such embodiments, a CERTAS® etch or a Siconi (also referred to as SiCoNi) etch may be used in the chemical etch. In some embodiments, the isotropic etch may include combinations of the wet etch and the chemical etch. It should be noted that in the isotropic etch, an etch selectivity between the ILD structure 150, the CESL 124, and the first and second dielectric structures 140 and 142 is greater than 8. For example, the etch selectivity of the chemical etch may be greater than 8, and the etch selectivity of the wet etch may be greater than 30. Therefore, the portions of the ILD structure 150 may be removed, while the first and second dielectric structures 140 and 142 have less material removed. Further, the metal gate structure 110 is protected by the first dielectric structure 140. In some embodiments, the CESL 124 may include materials different from those of the ILD structure 150; therefore, the CESL 124 may remain after the removing of the portions of the ILD structure 150. Accordingly, the CESL 124, the second dielectric structure 142 and the guardrail 144 may be exposed through sidewalls of the trench 151, and the CESL 124 may be exposed through a bottom of the trench 151. Additionally, a width of the trench 151 is consistent from its opening to its bottom.

In some embodiments, due to the enclosing design of the semiconductor structure, which includes the CESL 124, the first dielectric structure 140, the second dielectric structure 142 and the guardrail 144, the etch operation may be performed with greater selectivity. Further, due to enclosing design of the semiconductor structure and the greater selectivity of the etch operation, the trenches 151 (i.e., in the first region 104a and the second region 104b) may be formed with different sizes. The micro loading issue and the epitaxial loss issue may be mitigated.

Figure 14B:
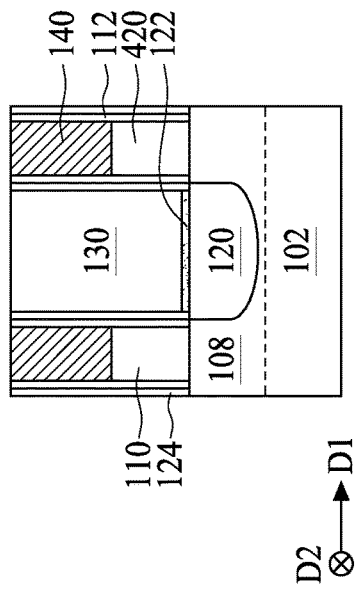
FIG. 14B is a schematic drawing illustrating a cross-sectional view of the semiconductor structure of FIG. 14A along line I-I'.
Figure 14C:
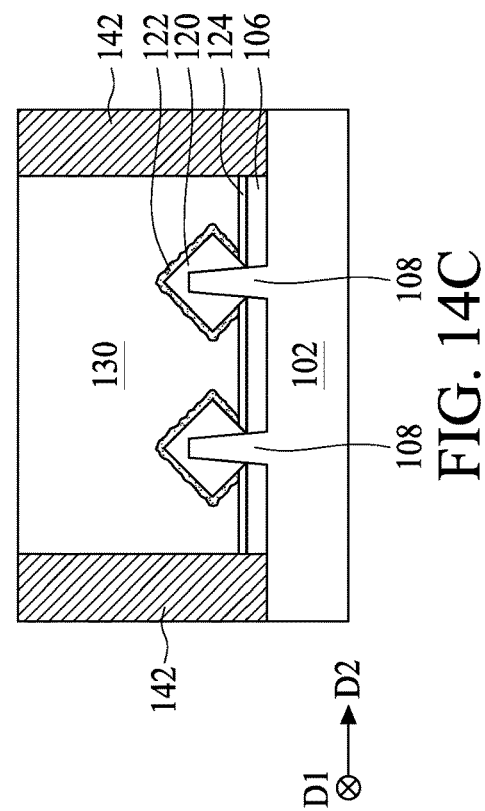
FIG. 14C is a schematic drawing illustrating a cross-sectional view of the semiconductor structure of FIG. 14A along line II-II'.
Figure 14A:
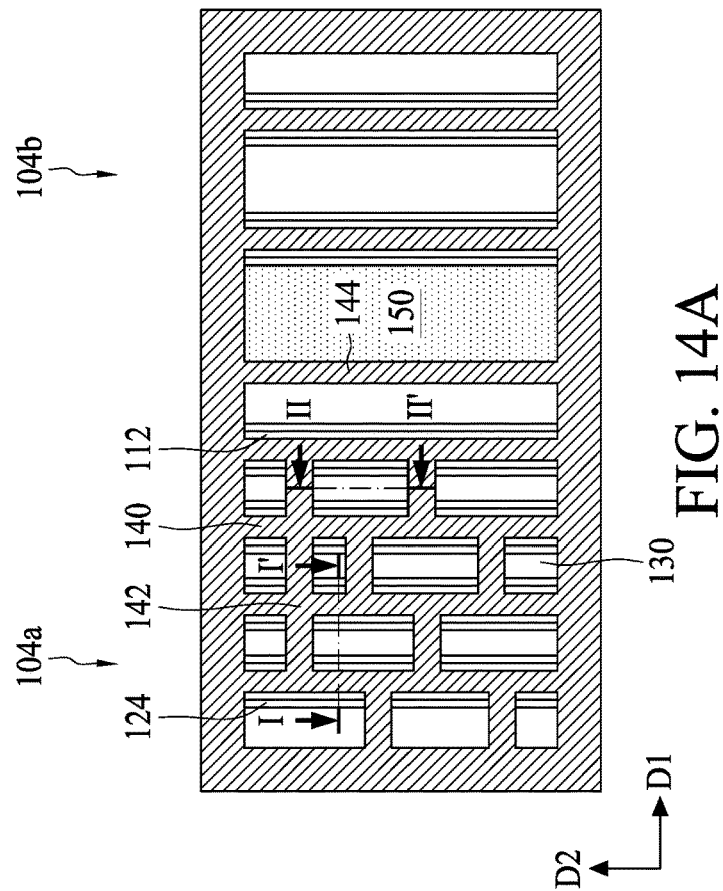
FIG. 14A is a schematic drawing illustrating a schematic top view of a semiconductor structure at a stage subsequent to that of FIG. 13A.

Referring to FIGS. 14A to 14C, in some embodiments, portions of the CESL 124 exposed through the bottom of the trench 151 are removed, such that the source/drain structure (i.e., the epitaxial layer 120 and the fin structure 108) is exposed. In some embodiments, a silicide layer 122 (shown in FIGS. 14B and 14C) may be formed over an epitaxial layer 120.

In some embodiments, a connecting structure 130 is formed in the trench 151 in operation 306. In some embodiments, a conductive material is formed to fill the trench 151, and a planarization operation such as a CMP is performed to remove superfluous conductive material. Consequently, thus the connecting structure 130 is obtained, as shown in FIGS. 14A to 14C. In some embodiments, the connecting structure 130 has a consistent width from its top to its bottom. In other words, a profile of the connecting structure 130 is improved. Further, a coverage rate of the connecting structure 130 and the silicide layer 122 on the epitaxial layer 120 is improved, and thus electrical connection between the device and the circuit may be improved.

According to enclosing design of the semiconductor structure provided by the method 300, the etch operation is performed with greater selectivity, the profile of the connecting structure 130 is improved, and a coverage rate of the connecting structure 130 and the silicide layer on the epitaxial layer 120 is improved. Further, the first dielectric structure 140 over the metal gate structure 110 may have less material removed due to the greater selectivity of the etch operation. Thus, a contact-to-gate leakage issue may be mitigated. As a result, a process yield is improved.

Figure 15:
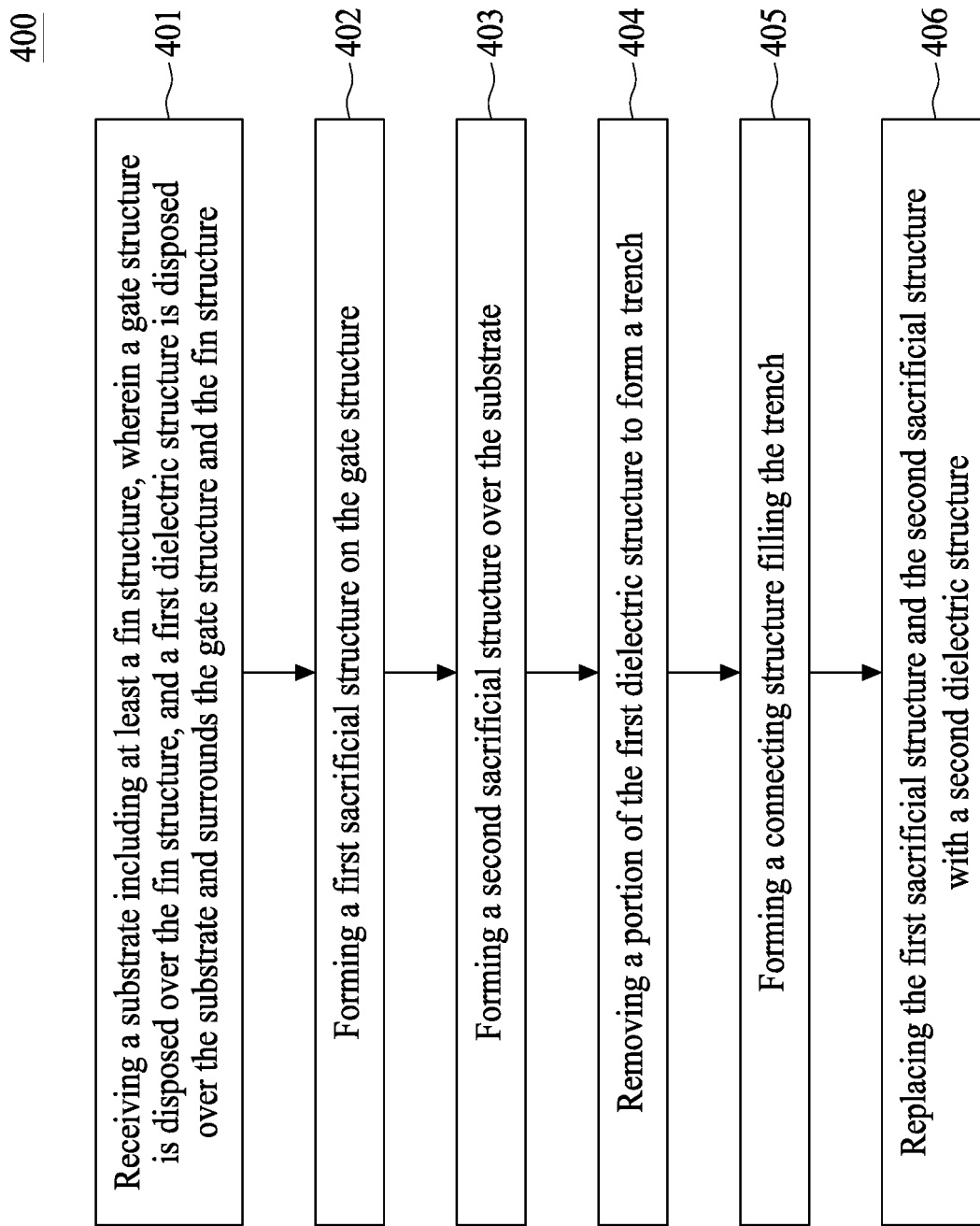
FIG. 15 is a flowchart of a method for forming a semiconductor structure according to aspects of the present disclosure in one or more embodiments.

FIG. 15 which is a flowchart of a method for forming a semiconductor structure 400 according to aspects of the present disclosure in one or more embodiments. The method for forming the semiconductor structure 400 includes a number of operations (401, 402, 403, 404, 405, and 406) and is further described below according to one or more embodiments. It should be noted that the operations of the method 400 may be omitted, rearranged or otherwise modified within the scope of the various aspects. It should further be noted that additional operations may be provided before, during, and after the method 400, and that some other operations may be only briefly described herein. Thus other implementations are possible within the scope of the various aspects described herein. FIGS. 16A to 22C are schematic drawings illustrating various stages in a method for forming a semiconductor structure according to aspects of one or more embodiments of the present disclosure. It should be noted that same elements in FIGS. 1 to 22C can include a same material; thus, repeated detailed descriptions of such elements are omitted for brevity.

Figure 16B:
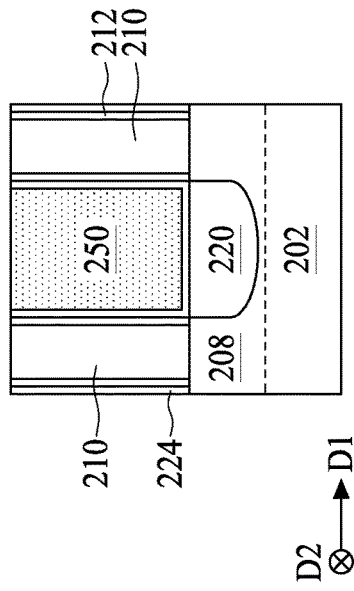
FIG. 16B is a schematic drawing illustrating a cross-sectional view of the semiconductor structure of FIG. 16A along line I-I'.
Figure 16C:
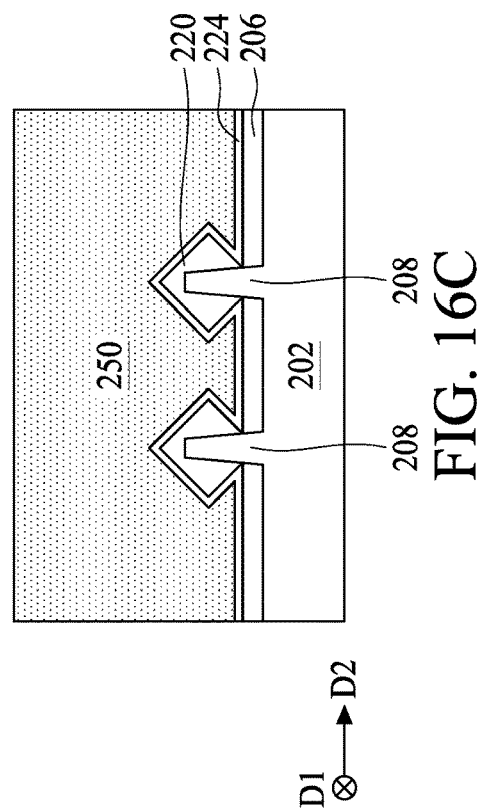
FIG. 16C is a schematic drawing illustrating a cross-sectional view of the semiconductor structure of FIG. 16A along line II-II'.
Figure 16A:
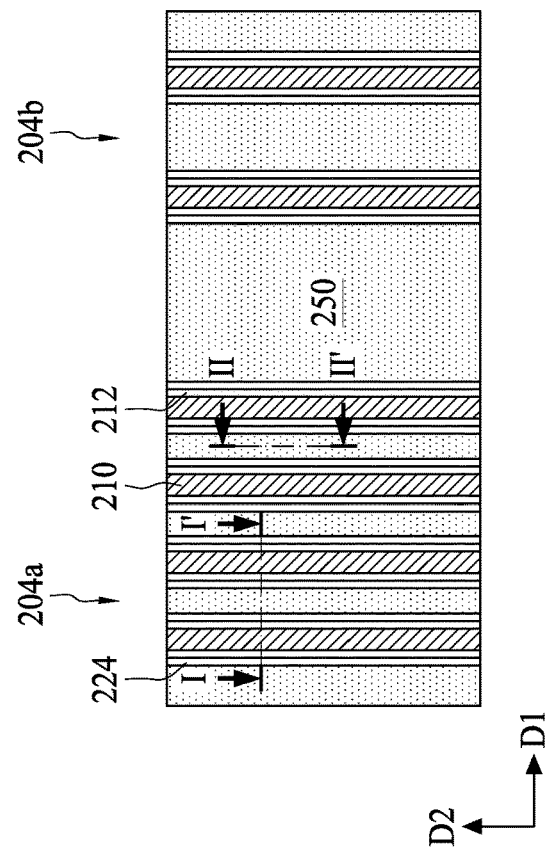
FIG. 16A is a schematic drawing illustrating a schematic top view of a semiconductor structure at a stage subsequent to that of FIG. 16A.

Referring to FIGS. 16A to 16C, in some embodiments, a substrate 202 is received in operation 401. In some embodiments, the substrate 202 may be defined as including a first region 204a and a second region 204b, as shown in FIG. 16A. The different regions 204a and 204b may be defined to accommodate devices of different sizes. At least a fin structure 208 is formed over the substrate 202. As mentioned above, an isolation structure 206 may be formed over the substrate 202 to separate different devices and fin structures 208. In some embodiments, a gate structure 210 is formed over the fin structure 208. In some embodiments, the gate structure 210 is a metal gate structure, and the metal gate structure 210 may be formed by a replacement operation as described in FIGS. 7A to 8C; thus, repeated descriptions of details are omitted herein for brevity. The metal gate structure 210 covers portions of the fin structure 208 and exposes portions of the fin structure 208. In some embodiments, spacers 212 may be formed over sidewalls of the metal gate structure 210.

In some embodiments, source/drain structures are formed over the fin structure 208 at two opposite sides of the gate structure 210 in accordance with some embodiments. In some embodiments, the source/drain structures include the portions of the fin structure 208 exposed through the gate structure 210 and an epitaxial layer 220. In some embodiments, the source/drain structures can be taller than a height of the portion of the fin structures 208 covered by the gate structure 210. In some embodiments, the epitaxial layer 220 may be formed by forming recesses in the fin structure 208 and growing a strained material in the recesses by an epitaxial (epi) process. In addition, a lattice constant of the strained material may be different from a lattice constant of the fin structure 208. Accordingly, the source/drain structures serve as stressors that improve carrier mobility. Further, a CESL 224 covers sidewalls of the gate structure 210. In some embodiments, the forming of the epitaxial layer 220 and the forming of the CESL 224 are performed prior to the forming of the metal gate structure, but the disclosure is not limited thereto.

Still referring to FIGS. 16A to 16C, in some embodiments, a first dielectric structure 250 is formed over the substrate 202. In some embodiments, the first dielectric structure 250 may be referred to as an ILD structure. As shown in FIGS. 16B and 16C, the first dielectric structure 250 surrounds the gate structure 210 and the fin structure 208. In some embodiments, the forming of the epitaxial layer 220, the forming of the CESL 224, and the forming of the first dielectric structure 250 are performed prior to the forming of the metal gate structure, but the disclosure is not limited thereto.

Referring to FIGS. 17A to 17C, in some embodiments, a first sacrificial structure 213 is formed on the metal gate structure 210 in operation 402. In some embodiments, a portion of the metal gate structure 210 is removed to form at least a recess 211, as shown in FIG. 17B. In some embodiments, the removal of the portion of the metal gate structure 210 includes a dry etch. In some embodiments, a BCl₃ plasma may be used in the dry etch, but the disclosure is not limited thereto. In some embodiments, the spacer 212 is exposed through sidewalls of the recess 211, and the metal gate structure 210 is exposed through a bottom of the recess 211.

Figure 18B:
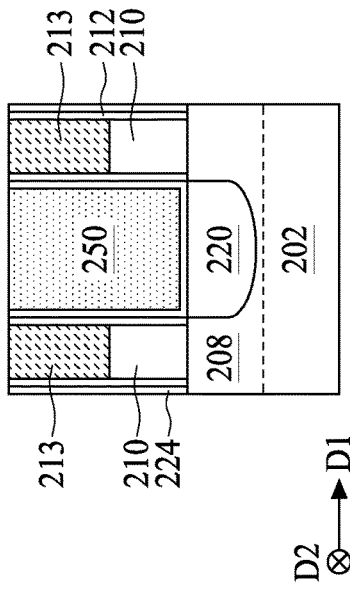
FIG. 18B is a schematic drawing illustrating a cross-sectional view of the semiconductor structure of FIG. 18A along line I-I'.
Figure 18C:
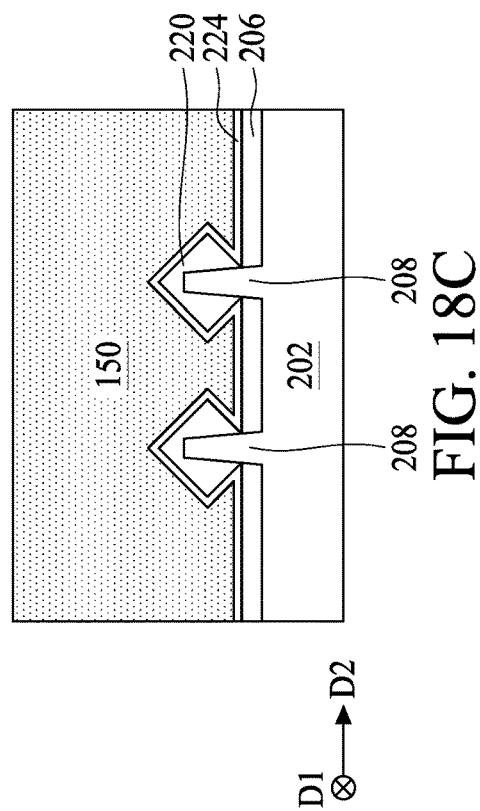
FIG. 18C is a schematic drawing illustrating a cross-sectional view of the semiconductor structure of FIG. 18A along line II-II'.
Figure 18A:
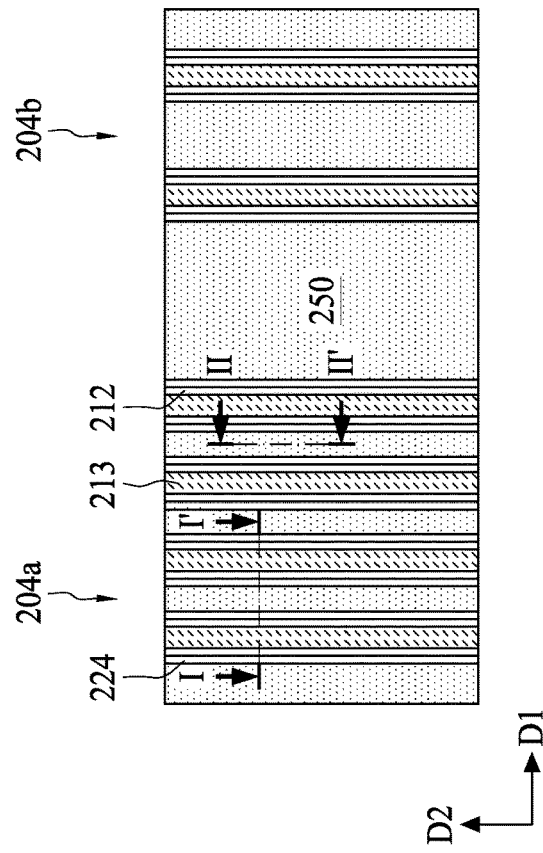
FIG. 18A is a schematic drawing illustrating a schematic top view of a semiconductor structure at a stage subsequent to that of FIG. 17A.

Referring to FIG. 18A to 18C, the first sacrificial structure 213 is formed in the recess 211. In some embodiments, the first dielectric structure 250 and the first sacrificial structure 213 include different materials. For example, the first dielectric structure 250 may include silicon oxide, and the first sacrificial structure 213 may include silicon or metal oxide. In some embodiments, the material used to form the first sacrificial structure 213 is used to fill the recess 211, and a planarization such as a CMP is performed to remove superfluous material. Accordingly, the first sacrificial structure 213 is obtained, as shown in FIG. 18B. In some embodiments, a top surface of the first sacrificial structure 213 is substantially aligned with (i.e., coplanar with) a top surface of the first dielectric structure 250. Further, sidewalls of the first sacrificial structure 213 are in contact with the spacer 212, and a bottom of the first sacrificial structure 213 is in contact with the metal gate structure 210. As shown in FIG. 18A, because the first sacrificial structure 213 is formed over the metal gate structure 210, the first sacrificial structure 213 extends in the direction D2.

Figure 19B:
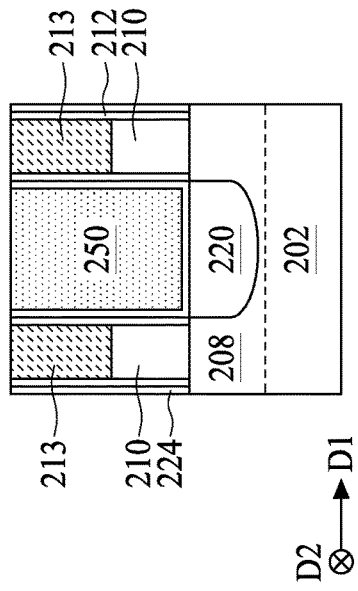
FIG. 19B is a schematic drawing illustrating a cross-sectional view of the semiconductor structure of FIG. 19A along line I-I'.
Figure 19C:
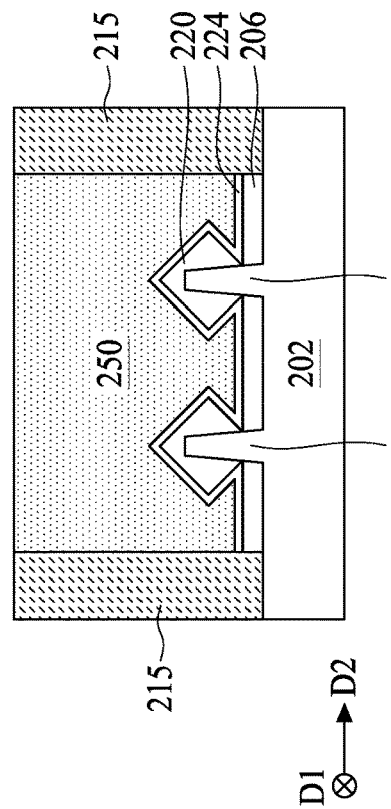
FIG. 19C is a schematic drawing illustrating a cross-sectional view of the semiconductor structure of FIG. 19A along line II-II'.
Figure 19A:
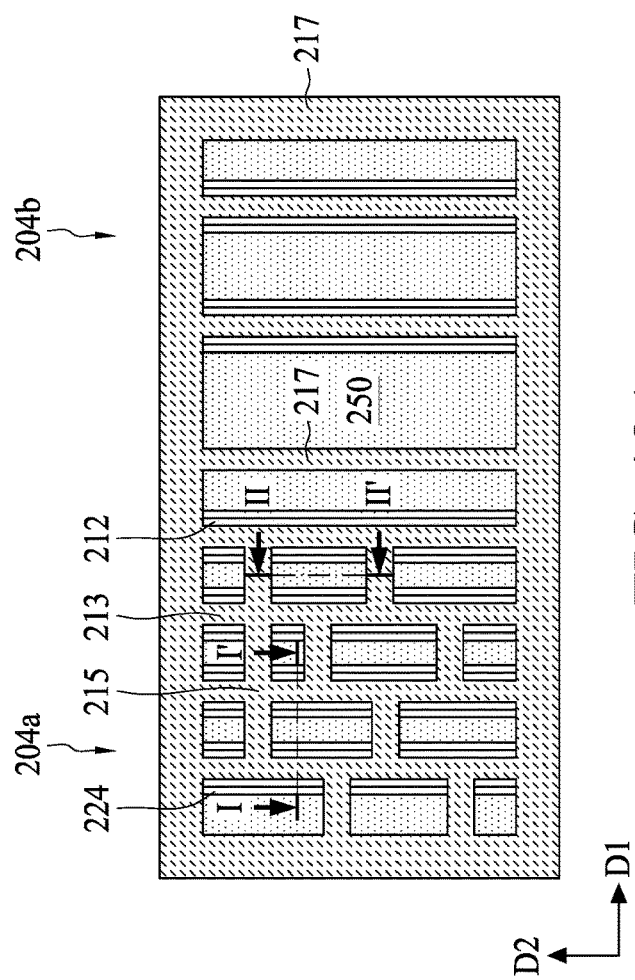
FIG. 19A is a schematic drawing illustrating a schematic top view of a semiconductor structure at a stage subsequent to that of FIG. 18A.

In some embodiments, a second sacrificial structure 215 is formed over the substrate 202 in operation 403. In some embodiments, a patterning operation may be performed to remove portions of the first dielectric structure 250 to form at least a recess (not shown). In such embodiments, the first dielectric structure 250 is exposed through sidewalls of the recess, and the substrate 202 is exposed through a bottom of the recess. Subsequently, the recess is filled with a material, and a planarization operation such as a CMP is performed to remove superfluous material. Accordingly, at least a second sacrificial structure 215 is formed over the substrate 202. In some embodiments, the second sacrificial structure 215 extends in the direction D1. Thus, the first sacrificial structure 213 and the second sacrificial structure 215 extend in different directions, as shown in FIG. 19A. In some embodiments, the second sacrificial structure 215 includes a material that is same as that of the first sacrificial structure 213. In some embodiments, sidewalls of the second sacrificial structure 215 are in contact with the ILD structure 250. Additionally, the sidewalls of the second sacrificial structure 215 may be in contact with the isolation structure 206 or the CESL 224. In some embodiments, the top surface of the first sacrificial structure 213, a top surface of the second sacrificial structure 215 and the top surface of the first dielectric structure 250 are substantially aligned with each other.

In some embodiments, a guardrail 217 may be formed simultaneously with the forming of the second sacrificial structure 215. In such embodiments, the guardrail 217 may include a material that is same as that of the first and second sacrificial structures 213 and 215. As shown in FIG. 19A, in some embodiments, the guardrail 217 surrounds the first and second sacrificial structures 213 and 215. Further, the guardrail 217 is coupled to the first and second sacrificial structures 213 and 215. Additionally, a portion of the guardrail 217 may be formed between the first region 204a and the second region 204b, but the disclosure is not limited thereto. In some embodiments, the first sacrificial structure 213, the second sacrificial structure 215 and the guardrail 217 form a grid, as shown in FIG. 19A, but the disclosure is not limited thereto.

In some embodiments, a portion of the ILD structure 250 is removed to form a trench 251 exposing a portion of the fin structure 208 in operation 404. Referring to FIGS. 20A to 20C, in some embodiments, a patterned hard mask (not shown) is formed over the first dielectric structure 250, the first sacrificial structure 213, the second sacrificial structure 215 and the guardrail 217. In some embodiments, portions of the first dielectric structure 250 exposed through the patterned hard mask are removed to form the trenches 251. In some embodiments, the trenches 251 are defined by the grid formed of the CESL 224, the first sacrificial structure 213, the second sacrificial structure 215 and the guardrail 217. In some embodiments, an isotropic etching is used to remove the portions of the first dielectric structure 250. The isotropic etching may be similar to those described above; therefore, repeated descriptions of details are omitted for brevity.

It should be noted that in the isotropic etch, an etch selectivity between the CESL 224, the first dielectric structure 250 and the first and second sacrificial structures 213 and 215 is greater than 8. Therefore, the portions of the first dielectric structure 250 may be removed, while the first and second sacrificial structures 213 and 215 have less material removed. Further, the metal gate structure 210 is protected by the first sacrificial structure 213. In some embodiments, the CESL 224 may include materials different from those of the first dielectric structure 250; therefore, the CESL 224 may remain after the removing of the portions of the first dielectric structure 250. Accordingly, the CESL 224, the second sacrificial structure 215 and the guardrail 217 may be exposed through sidewalls of the trench 251, and the CESL 224 may be exposed through a bottom of the trench 251. Additionally, a width of the trench 251 is consistent from its opening to its bottom.

As mentioned above, due to the enclosing design of the semiconductor structure, which includes the first sacrificial structure 213, the second sacrificial structure 215 and the guardrail 217, the etch operation may be performed with greater selectivity. Further, due to the enclosing design of the semiconductor structure and the greater selectivity of the etch operation, the trenches 251 of different sizes (in the first region 204a and the second region 204b) may be formed. The micro loading issue and the epitaxial loss issue may be mitigated.

Figure 21B:
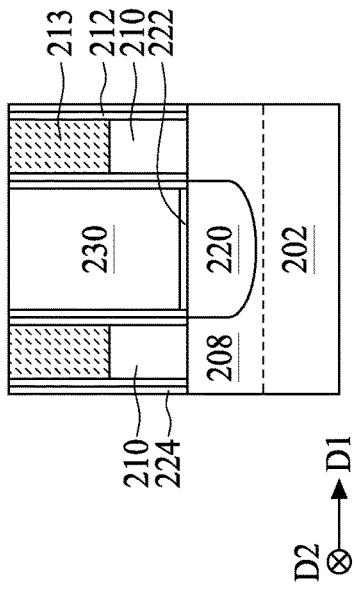
FIG. 21B is a schematic drawing illustrating a cross-sectional view of the semiconductor structure of FIG. 21A along line I-I'.
Figure 21C:
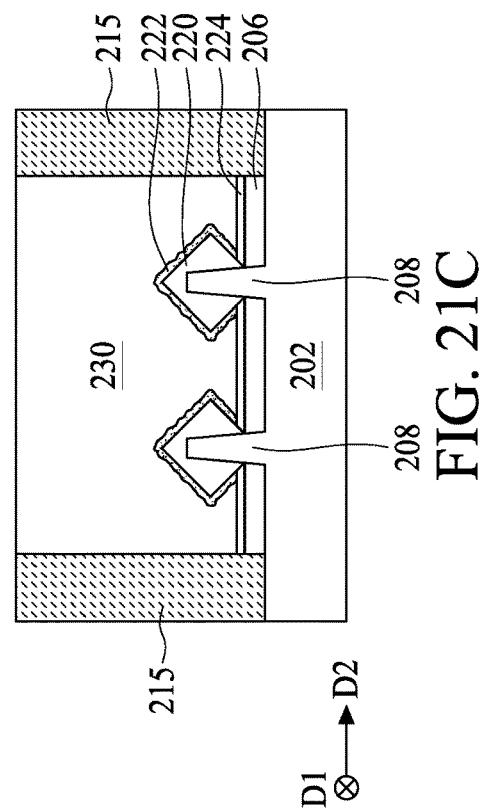
FIG. 21C is a schematic drawing illustrating a cross-sectional view of the semiconductor structure of FIG. 21A along line II-II'.
Figure 21A:
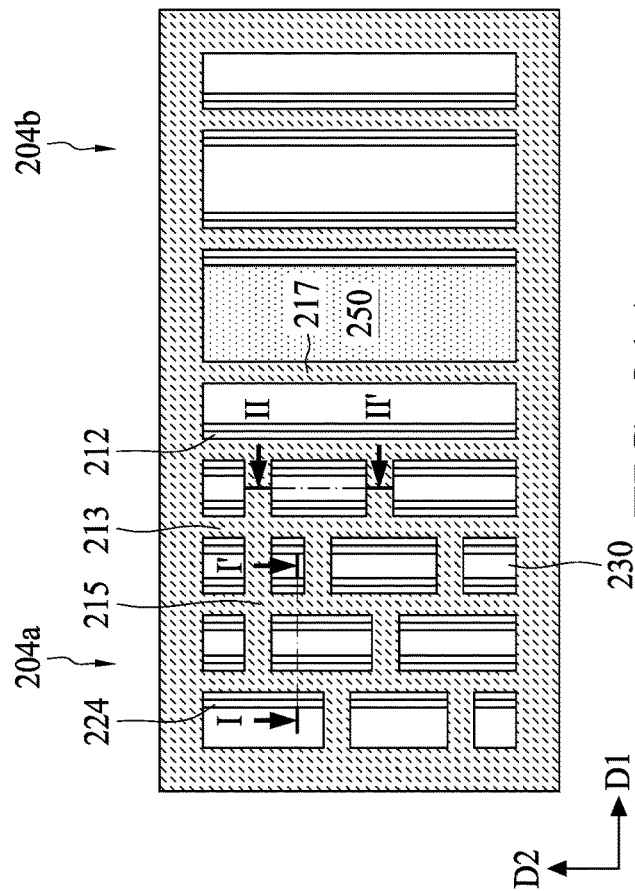
FIG. 21A is a schematic drawing illustrating a schematic top view of a semiconductor structure at a stage subsequent to that of FIG. 20A.

Referring to FIGS. 21A to 21C, in some embodiments, a portion of the CESL 224 exposed through the sidewalls and the bottom of the trench 251 may be removed, such that the source/drain structure (i.e., the epitaxial layer 220 and the fin structure 208) is exposed. In some embodiments, a silicide layer 222 may be formed over the epitaxial layer 220.

In some embodiments, a connecting structure 230 is formed in the trench 251 in operation 406. In some embodiments, a conductive material is formed to fill the trench 251, and a planarization operation such as a CMP is performed to remove superfluous conductive material. Accordingly, the connecting structure 230 is obtained, as shown in FIGS. 21A to 21C. In some embodiments, the connecting structure 230 has a consistent width from its top to its bottom. In other words, a profile of the connecting structure 230 is improved. Further, a coverage rate of the connecting structure 230 and the silicide layer 222 on the epitaxial layer 220 is improved, and thus electrical connection between the device and the circuit may be improved.

Figure 22B:
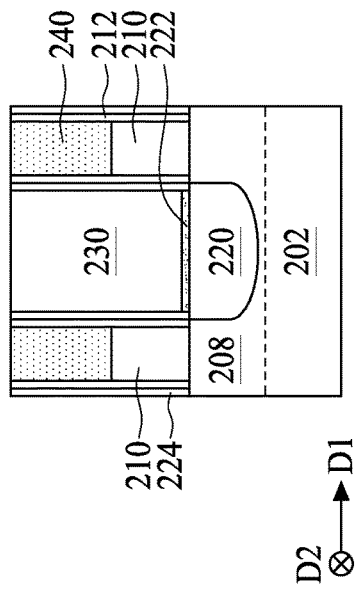
FIG. 22B is a schematic drawing illustrating a cross-sectional view of the semiconductor structure of FIG. 22A along line I-I'.
Figure 22C:
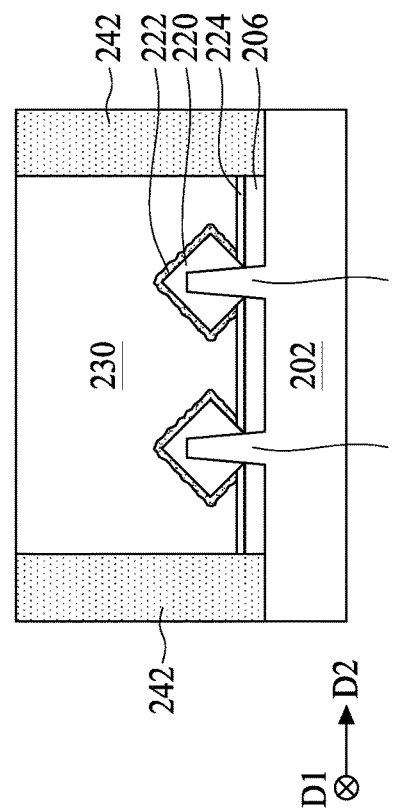
FIG. 22C is a schematic drawing illustrating a cross-sectional view of the semiconductor structure of FIG. 22A along line II-II'.
Figure 22A:
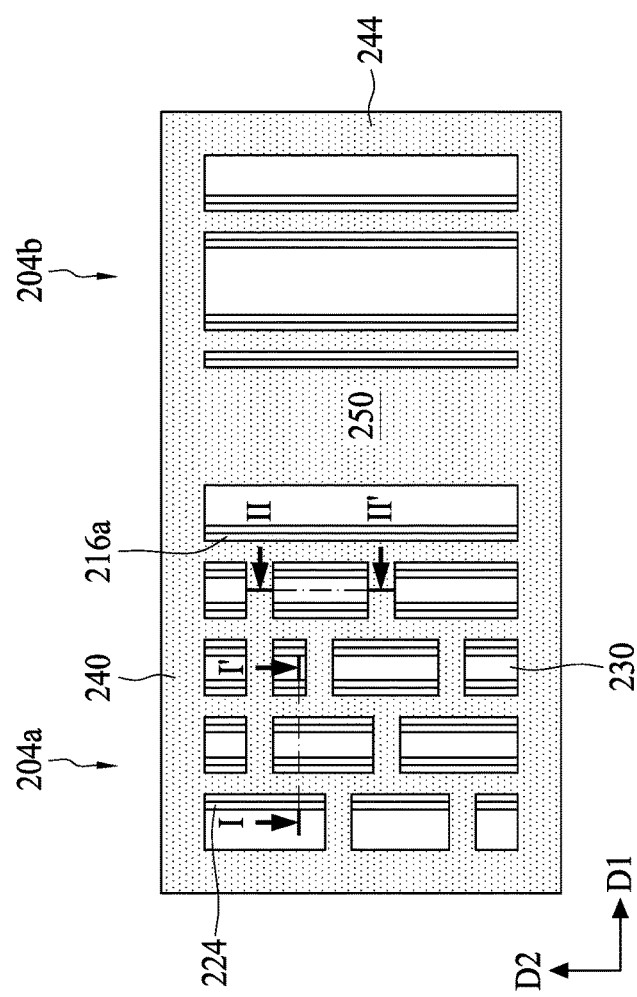
FIG. 22A is a schematic drawing illustrating a schematic top view of a semiconductor structure at a stage subsequent to that of FIG. 21A.

Referring to FIGS. 22A to 22C, in some embodiments, the first sacrificial structure 213 and the second sacrificial structure 215 are replaced with a second dielectric structure in operation 406. In some embodiments, the second dielectric structure may include a material that is same as that of the first dielectric structure 250. In some alternative embodiments, the second dielectric structure may include a material different from that of the first dielectric structure 250. In such embodiments, the second dielectric structure may include silicon nitride or low-k materials.

Still referring to FIGS. 22A to 22C, in some embodiments, the second dielectric structure may include at least a first portion 240 and a second portion 242. The first portion 240 replaces the first sacrificial structure 213, while the second portion 242 replaces the second sacrificial structure 215. In some embodiments, the second dielectric structure further includes a third portion 244, wherein the third portion 244 replaces the guardrail 217.

In some embodiments, due to the enclosing design of the semiconductor structure, which includes the first sacrificial structure 213, the second sacrificial structure 215 and the guardrail 217, the etch operation may be performed with greater selectivity. Further, due to the enclosing design of the semiconductor structure and the greater selectivity of the etch operation, the trenches 251 of different sizes (i.e., in the first region 204a and the second region 204b) may be formed. The micro loading issue and the epitaxial loss issue may be mitigated.

According to enclosing design of the semiconductor structure provided by the method 400, the etch operation may be performed with greater selectivity, the profile of the connecting structure 230 is improved, and a coverage rate of the connecting structure 230 and the silicide layer on the epitaxial layer 220 is improved. Further, the first sacrificial structure 213 over the metal gate structure 210 may have less material removed due to the greater selectivity of the etch operation. Thus, a contact-to-gate leakage issue may be mitigated. As a result, a process yield is improved.

In some embodiments, the method 400 may further include following operations. Please refer to FIGS. 23A to 31B, which are schematic drawings illustrating a semiconductor structure at various stages subsequent to that of FIGS. 19A and 19B according to aspects of one or more embodiments of the present disclosure. It should be noted that same elements in FIGS. 1 to 31B can include a same material; thus, repeated detailed descriptions of such elements are omitted for brevity.

Figure 23A:
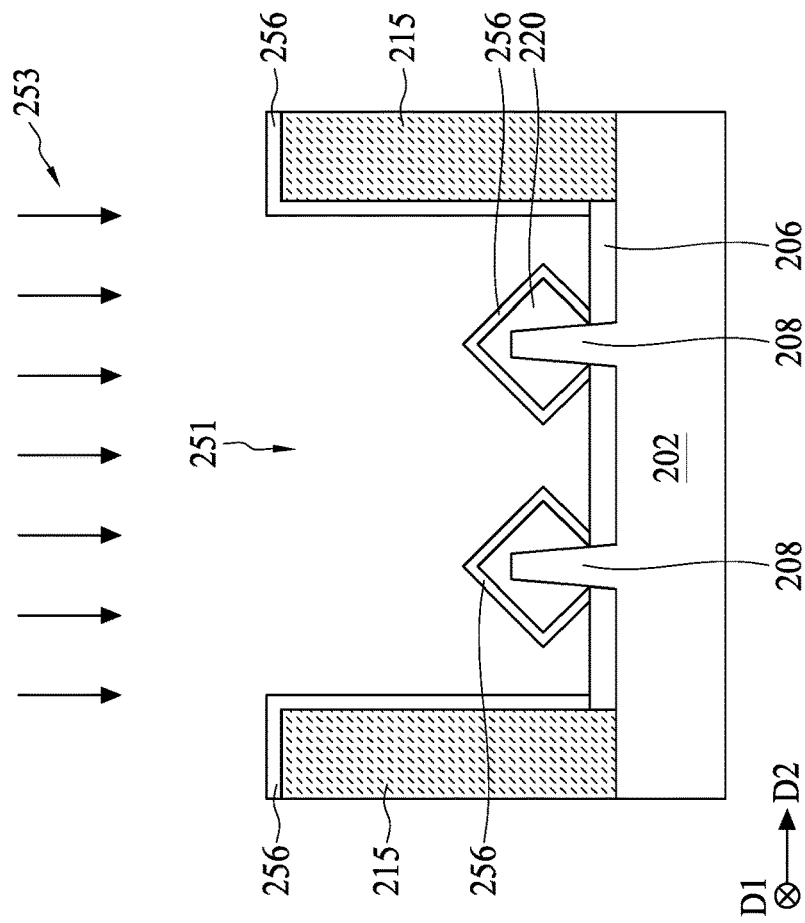
FIG. 23A is a schematic drawing illustrating a schematic top view of a semiconductor structure at a stage subsequent to that of FIGS. 19B, and 23B is a schematic drawing illustrating a schematic top view of a semiconductor structure at a stage subsequent to FIG. 19C.
Figure 23B:
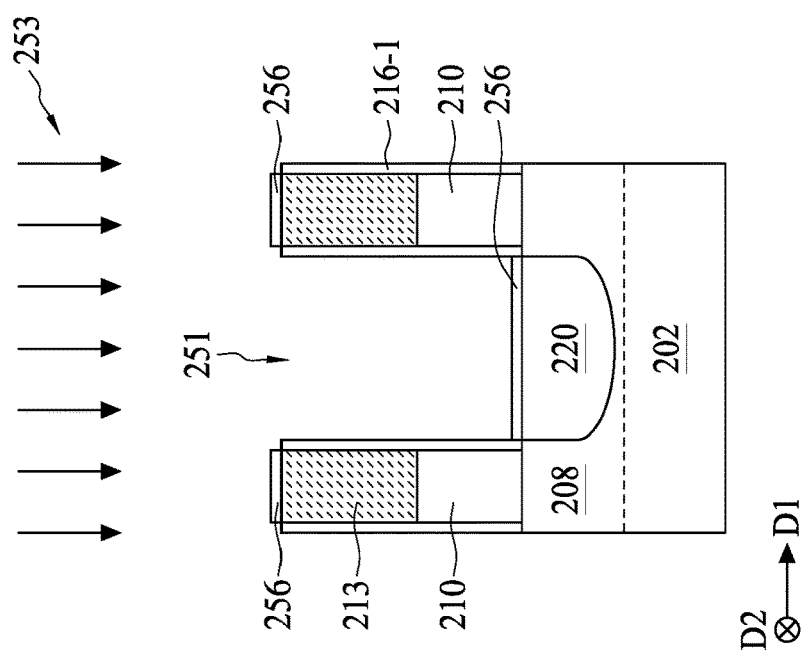

In some embodiments, after the removing of the portion of the dielectric structure 250 to form the trench 251 and the removing of the portion of the CESL 224, a surface treatment 253 is performed. In some embodiments, the surface treatment 253 may include an oxygen treatment. Accordingly, an oxide layer 256 is formed over the exposed epitaxial layer 220, as shown in FIGS. 23A and 23C. In some embodiments, when the first and second sacrificial structures 213 and 215 include silicon, the oxide layer 256 is also formed over the first and second sacrificial structures 213 and 215, as shown in FIGS. 23A and 23B. Further, the oxide layer 256 is formed over the sidewalls of the second sacrificial structure 215, as shown in FIG. 23B. It should be noted that in such embodiments, the sidewalls of the metal gate structure 210 and the sidewalls of the first sacrificial structure 213 are covered by the spacer 216-1, while sidewalls of the second sacrificial structure 215 are covered by the oxide layer 256.

Referring to FIGS. 24A and 24B, in some embodiments, after the forming of the oxide layer 256, a sacrificial layer 257 is formed over the substrate 202. In some embodiments, the sacrificial layer 257 includes a material different from that of the first dielectric structure 250. In some embodiments, the material of the sacrificial layer 257 may be similar to that of the first and second sacrificial structures 213 and 215. For example, the first sacrificial structure 213, the second sacrificial structure 215 and the sacrificial layer 257 may all include silicon, but the disclosure is not limited thereto.

Referring to FIGS. 25A and 25B, in some embodiments, an etch-back operation may be performed to remove portions of the sacrificial layer 257. Accordingly, a sacrificial spacer 257 is obtained. In some embodiments, the sacrificial spacer 257 is exposed through the sidewalls of the trench 251, and the oxide layer 256 is exposed through the bottom of the trench 251. In other words, sidewalls of the second sacrificial structure 215 are covered by the sacrificial spacer 257. Further, the top surface of the first sacrificial structure 213 and surfaces of the epitaxial layer 220 remain covered by the oxide layer 256.

Figures 26A, 26B:
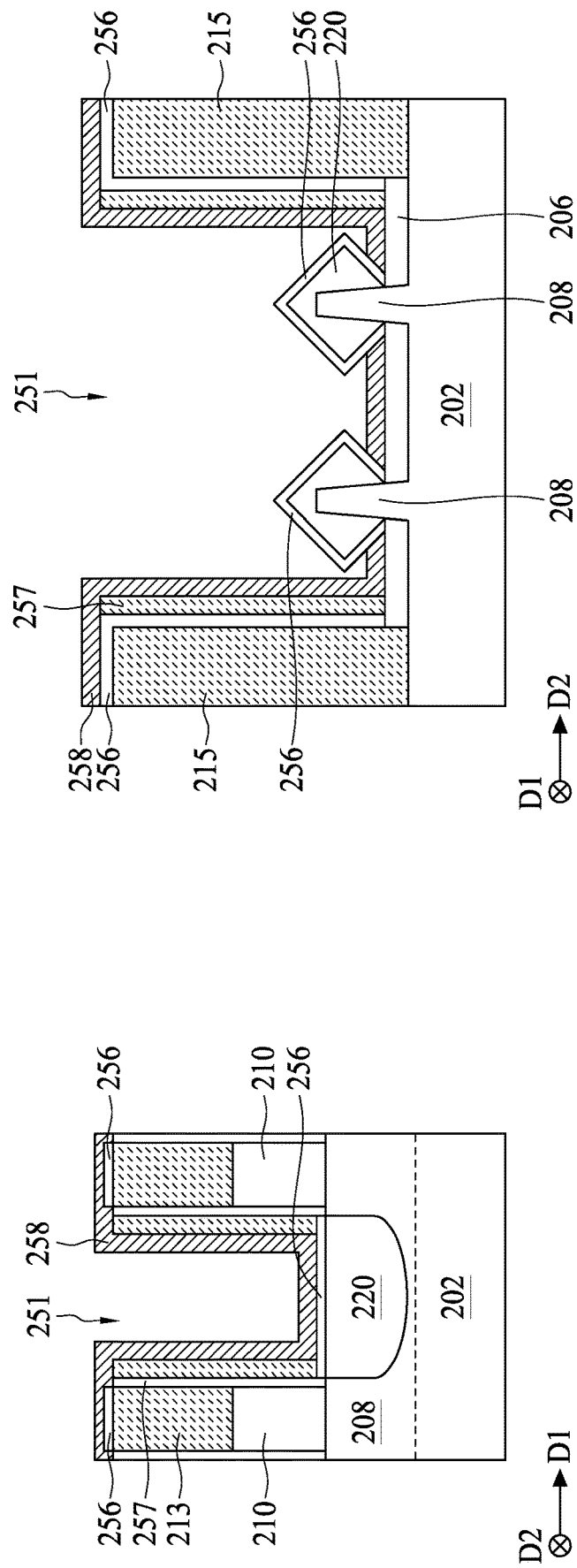
FIG. 26A is a schematic drawing illustrating a schematic top view of a semiconductor structure at a stage subsequent to that of FIGS. 25A, and 26B is a schematic drawing illustrating a schematic top view of a semiconductor structure at a stage subsequent to that of FIG. 25B.

Referring to FIGS. 26A and 26B, in some embodiments, a dielectric layer 258 is formed over the substrate 202. In some embodiments, the dielectric layer 258 includes a material different from that of the first and second sacrificial structures 213 and 215.

Figure 27B:
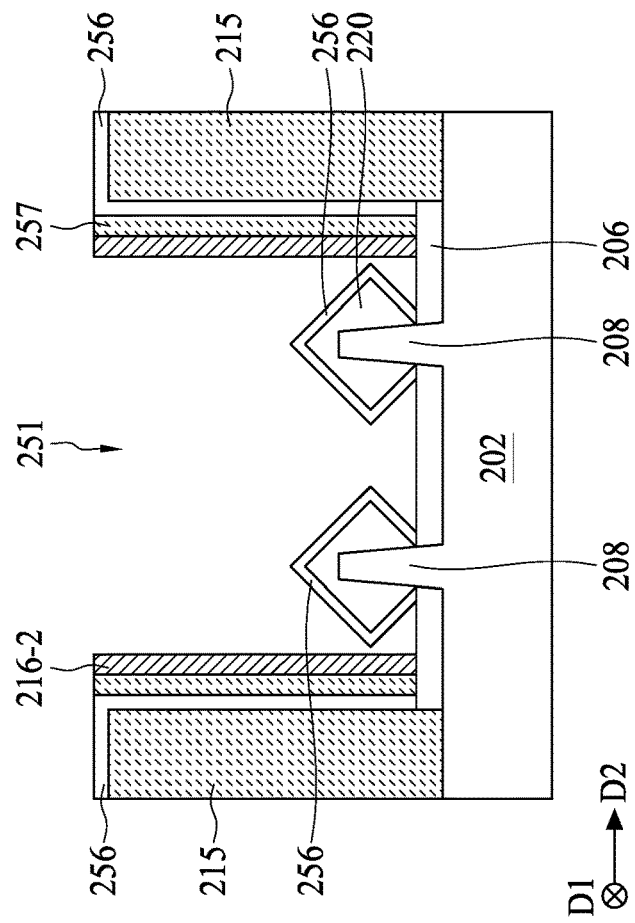
FIG. 27A is a schematic drawing illustrating a schematic top view of a semiconductor structure at a stage subsequent to that of FIGS. 26A, and 27B is a schematic drawing illustrating a schematic top view of a semiconductor structure at a stage subsequent to that of FIG. 26B.
Figure 27A:
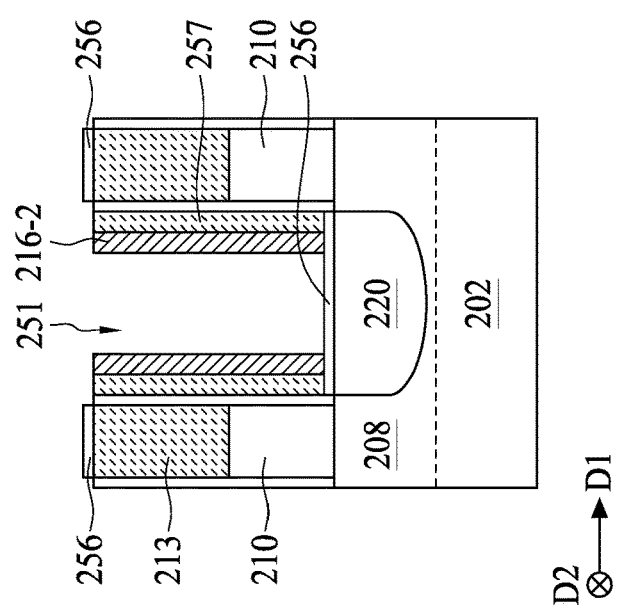

Referring to FIGS. 27A and 27B, an etch back operation may be performed to remove portions of the dielectric layer 258. Accordingly, a liner spacer 216-2 is obtained. In some embodiments, the liner spacer 216-2 is exposed through the sidewalls of the trench 251, and the oxide layer 256 is exposed through the bottom of the trench 251.

Figure 28A:
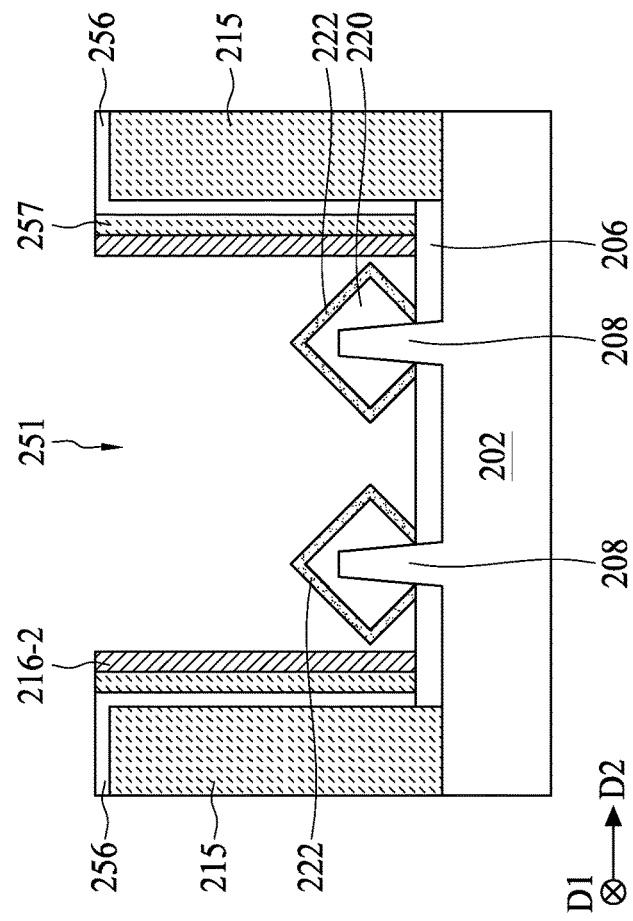
FIG. 28A is a schematic drawing illustrating a schematic top view of a semiconductor structure at a stage subsequent to that of FIGS. 27A, and 28B is a schematic drawing illustrating a schematic top view of a semiconductor structure at a stage subsequent to that of FIG. 27B.
Figure 28B:
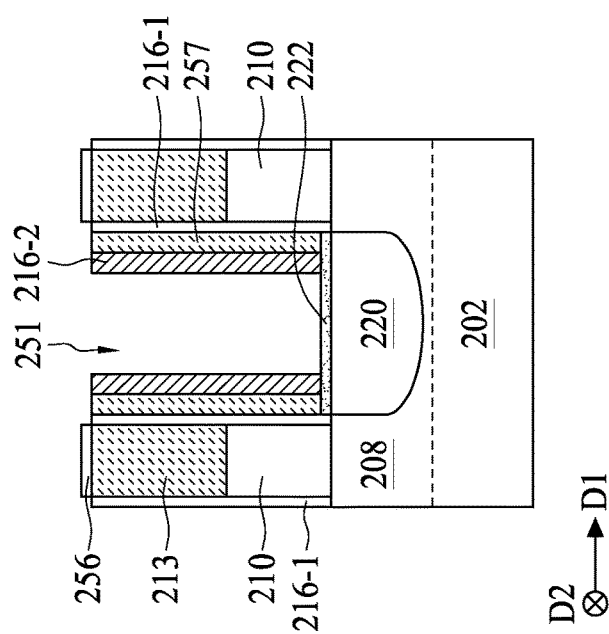

Referring to FIGS. 28A and 28B, portions of the oxide layer 256 are removed. In some embodiments, the portions of the oxide layer 256 that are over the epitaxial layer 220 is removed. Further, a silicide layer 222 may be formed over the exposed epitaxial layer 220.

Referring to FIGS. 29A and 29B, a connecting structure 230 is formed in the trench 251 in operation 405. In some embodiments, a conductive material is formed to fill the trench 251, and a planarization operation such as a CMP is performed to remove superfluous conductive material. Accordingly, the connecting structure 230 is obtained, as shown in FIGS. 29A and 29B. In some embodiments, the oxide layer 256 over the first sacrificial structure 213 may be removed by the planarization operation. In some embodiments, the connecting structure 230 has a consistent width from its top to its bottom. In other words, a profile of the connecting structure 230 is improved. Further, a coverage rate of the connecting structure 230 and the silicide layer 222 on the epitaxial layer 220 is improved, and thus electrical connection between the device and the circuit may be improved.

Figure 30B:
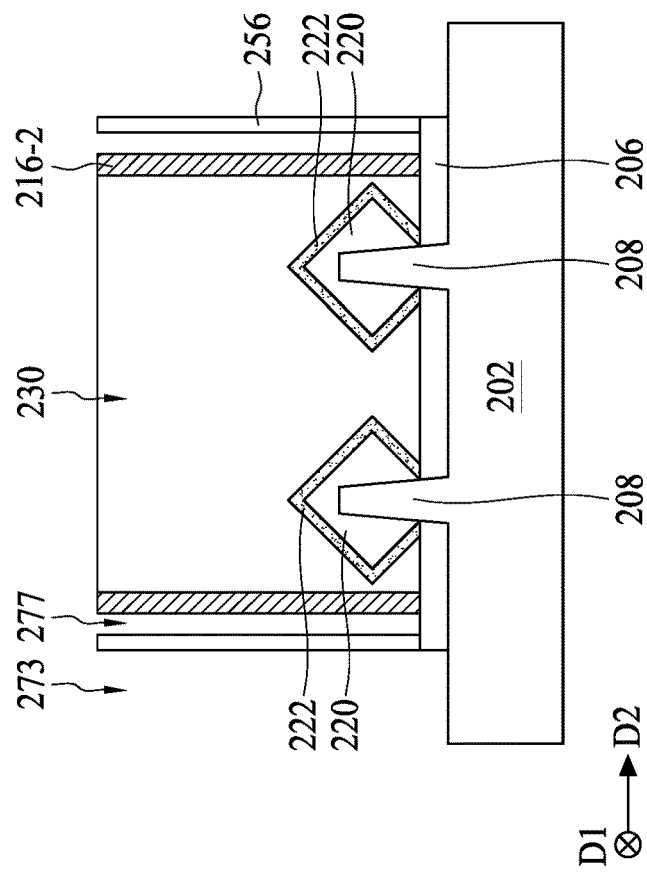
FIG. 30B is a schematic drawing illustrating a schematic top view of a semiconductor structure at a stage subsequent to that of FIG. 29B.
Figure 30A:
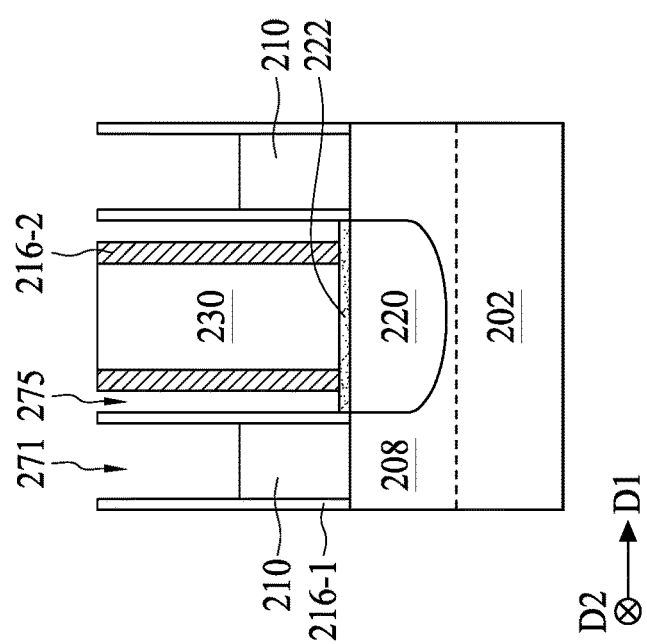
FIG. 30A is a schematic drawing illustrating a schematic top view of a semiconductor structure at a stage subsequent to that of FIG. 29A.

Referring to FIGS. 30A to 31B, in some embodiments, the first sacrificial structure 213 and the second sacrificial structure 215 are replaced with a second dielectric structure 240 in operation 406. Further, the sacrificial spacer 257 may also be replaced with an air spacer 218. In some embodiments, the first sacrificial structure 213 and the second sacrificial structure 215 are removed, thus forming a plurality of first openings 271 and a plurality of second openings 273 over the substrate 202. As shown in FIG. 30A, the spacer 216-1 may be exposed through sidewalls of the first opening 271, and the metal gate structure 210 may be exposed through a bottom of the first opening 271. As shown in FIG. 30B, the liner spacer 216-2 may be exposed through sidewalls of the second opening 273, and the isolation structure 224 may be exposed though a bottom of the second opening 273.

Further, the sacrificial spacer 257 is removed to form a first gap 275 and a second gap 277. As shown in FIG. 30A, the first gap 275 is between the spacer 216-1 and the liner spacer 216-2. AS shown in FIG. 30B, the second gap 277 is between the liner 216-2 and the oxide layer 256.

Figure 31B:
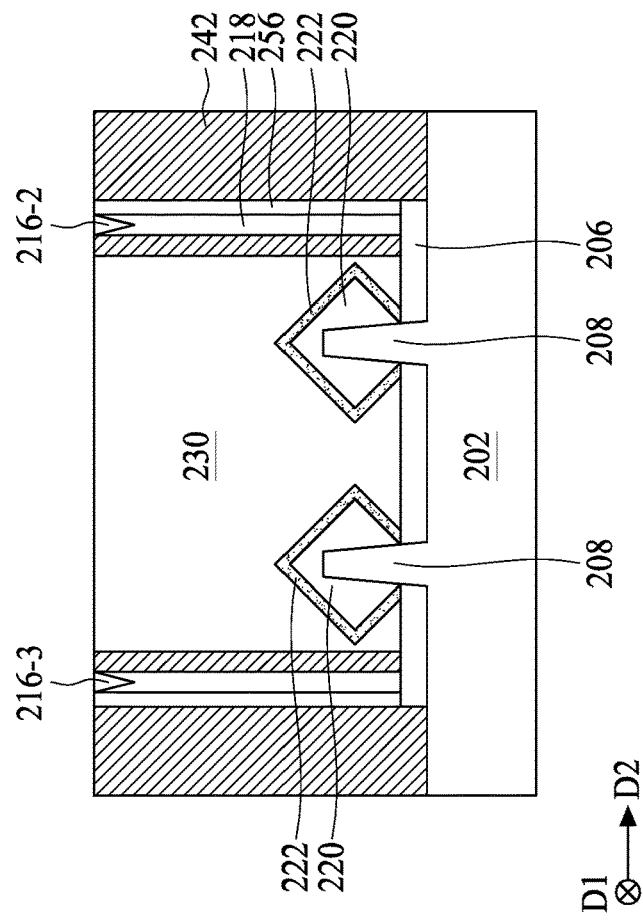
FIG. 31B is a schematic drawing illustrating a schematic top view of a semiconductor structure at a stage subsequent to that of FIG. 30B.
Figure 31A:
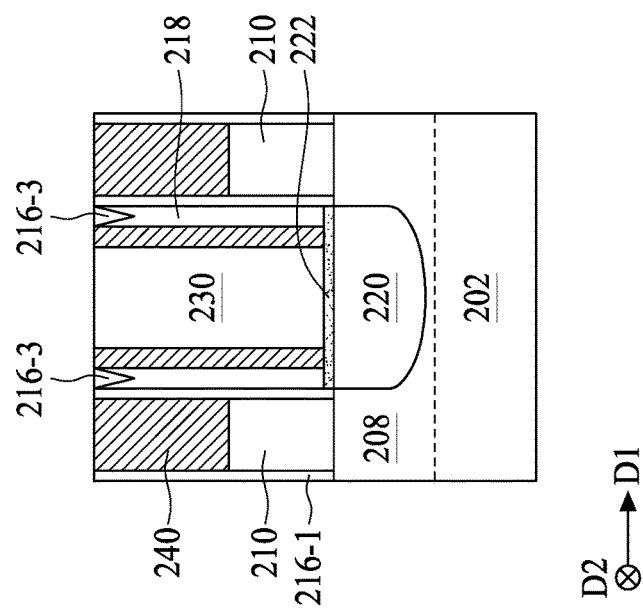
FIG. 31A is a schematic drawing illustrating a schematic top view of a semiconductor structure at a stage subsequent to that of FIG. 30A.

Referring to FIGS. 31A and 31B, Referring to FIGS. 22A to 22C, in some embodiments, a second dielectric structure is formed to fill the first and second openings 271 and 273. In some embodiments, the second dielectric structure may include a material that is same as that of the first dielectric structure 250. In some alternative embodiments, the second dielectric structure may include a material different from that of the first dielectric structure 250. In such embodiments, the second dielectric structure may include silicon nitride or low-k materials.

Still referring to FIGS. 31A and 31B, in some embodiments, the second dielectric structure may include at least a first portion 240 and a second portion 242. The first portion 240 replaces the first sacrificial structure 213, while the second portion 242 replaces the second sacrificial structure 215. In some embodiments, the second dielectric structure further includes a third portion (not shown), wherein the third portion replaces the guardrail 217. In some embodiments, a third dielectric structure 216-3 is formed to seal the first and second gaps 275 and 277. The third dielectric structure 216-3 is formed simultaneously with the forming of the second dielectric structure. Further, the second dielectric structure 240/242 and the third dielectric structures 216-3 may include a same material. In some embodiments, the second dielectric structure 240/242 and third dielectric structure 216-3 may include a material that is same as that of the first dielectric structure 250. In some alternative embodiments, the second dielectric structure 240/242 and third dielectric structure 216-3 may include a material different from that of the first dielectric structure 250. In such embodiments, the second dielectric structure 240/242 and the third dielectric structure 216-3 may include silicon nitride or low-k materials.

In some embodiments, the spacer 216-1, the liner spacer 216-2, the oxide layer 256 and the third dielectric structure 216-3 form a solid spacer 214 (shown in FIG. 5A). The air spacer 218 is sealed within the solid spacer 214. In other words, the air spacer 218 is sealed by the spacer 216-1, the liner spacer 216-2, the oxide layer 258 and the third dielectric structure 216-3. In some embodiments, the solid spacer 214 and the air spacer 218 form a hybrid spacer 212 (shown in FIG. 5A).

In some embodiments, due to the enclosing design of the semiconductor structure, which includes the first sacrificial structure 213, the second sacrificial structure 215 and the guardrail 217, the etch operation may be performed with greater selectivity. Further, due to the enclosing design of the semiconductor structure and the greater selectivity of the etch operation, the trenches 251 of different sizes (i.e., in the first region 204a and the second region 204b) may be formed. The micro loading issue and the epitaxial loss issue may be mitigated. Further, a capacitance between the connecting structure 230 and the metal gate structure 210 may be reduced because of the air spacer 218.

According to enclosing design of the semiconductor structure provided by the method 400, the etch operation may be performed with greater selectivity, the profile of the connecting structure 230 is improved, and a coverage rate of the connecting structure 230 and the silicide layer on the epitaxial layer 220 is improved. Further, the first sacrificial structure 213 over the metal gate structure 210 may have less material removed due to the greater selectivity of the etch operation. Thus a contact-to-gate leakage issue may be mitigated. As a result, a process yield is improved.

The present disclosure therefore provides a semiconductor structure and a method to mitigate the dielectric loss issue. In some embodiments, the semiconductor structure provides first and second dielectric structures for defining locations and dimensions of MEOL connecting structures. Further, the first and second dielectric structures provide greater selectivity such that unwanted dielectric loss may be mitigated. The first and second dielectric structures may include low-k material such that capacitance between the MEOL connecting structures and FEOL devices may be reduced. In some embodiments, the semiconductor structure may further include an air spacer for improving electrical isolation.

In some embodiments, a semiconductor structure is provided. The semiconductor structure includes at least a fin structure, a gate structure over the fin structure, a connecting structure, a first dielectric structure over the gate structure, and a second dielectric structure. The fin structure extends in a first direction, and the gate structure extends in a second direction different from the first direction. The connecting structure is disposed over the fin structure and isolated from the gate structure. The second dielectric structure extends in the first direction. The first dielectric structure and the second dielectric structure include a same material. A top surface of the first dielectric structure and a top surface of the second dielectric structure are substantially aligned with each other.

In some embodiments, a semiconductor structure is provided. The semiconductor structure includes at least a fin structure, a gate structure over the fin structure, a spacer at sidewalls of the gate structure, a connecting structure disposed over the fin structure, a first dielectric layer over the gate structure, and a second dielectric structure. The fin structure extends in a first direction, and the gate structure extends in a second direction different from the first direction. The spacer includes a solid spacer and an air spacer disposed within the solid spacer. The connecting structure is isolated from the gate structure by the spacer. The second dielectric structure extends in the first direction.

In some embodiments, a semiconductor structure is provided. The semiconductor structure includes a substrate, at least a fin structure, a gate structure over the fin structure, a first dielectric structure over the gate structure, a second dielectric structure over the substrate, and an isolation structure over the substrate. The fin structure and the second dielectric structure extend in a first direction, and the gate structure and the first dielectric structure extend in a second direction. The first dielectric structure and the second dielectric structure form a grid pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
at least a fin structure extending in a first direction;
a gate structure over the fin structure and extending in a second direction different from the first direction;
a connecting structure disposed over the fin structure and isolated from the gate structure;
a first dielectric structure over the gate structure; and
a second dielectric structure extending in the first direction,
wherein the first dielectric structure and the second dielectric structure comprise a same material, and a top surface of the first dielectric structure and a top surface of the second dielectric structure are substantially aligned with each other.

2. The semiconductor structure of claim 1, further comprising:
an epitaxial layer on the fin structure; and
a silicide layer on the epitaxial layer,
wherein the connecting structure is in contact with the silicide layer.

3. The semiconductor structure of claim 2, wherein a coverage rate of the silicide layer over the epitaxial layer is greater than 50%.

4. The semiconductor structure of claim 1, further comprising a spacer disposed at sidewalls of the gate structure, wherein the connecting structure is isolated from the gate structure by the spacer.

5. The semiconductor structure of claim 4, wherein the spacer further comprises:
a solid spacer; and
an air spacer disposed within the solid spacer.

6. The semiconductor structure of claim 1, wherein the connecting structure has a consistent width.

7. The semiconductor structure of claim 1, further comprising a third dielectric structure, wherein the third dielectric structure comprises a material different from that of the first dielectric structure and the second dielectric structure.

8. The semiconductor structure of claim 1, wherein the first dielectric structure and the second dielectric structure comprise silicon nitride or low-k material.

9. The semiconductor structure of claim 1, wherein first dielectric structure extends in the second direction.

10. A semiconductor structure comprising:
a substrate;
at least a fin structure over the substrate;
a gate structure over the fin structure and the substrate;
a first dielectric structure over the gate structure; and
a second dielectric structure over the substrate,
wherein the fin structure and the second dielectric structure extend in a first direction, and the gate structure and first dielectric structure extend in a second direction different from the first direction,
wherein a top surface of the first dielectric structure and a top surface of the second dielectric structure are substantially aligned with each other, and
wherein the first dielectric structure and the second dielectric structure comprise a same material.

11. The semiconductor structure of claim 10, further comprising a connecting structure disposed over the fin structure and isolated from the gate structure.

12. The semiconductor structure of claim 11, wherein the connecting structure has a consistent width.

13. The semiconductor structure of claim 11, wherein the first dielectric structure and second dielectric structure surround the connecting structure from a top view.

14. The semiconductor structure of claim 10, further comprising a spacer disposed at sidewalls of the gate structure.

15. The semiconductor structure of claim 10, further comprising a third dielectric structure, wherein the third dielectric structure comprises a material different from that of the first dielectric structure and the second dielectric structure.

16. A semiconductor structure comprising:
at least a fin structure extending in a first direction;
a gate structure over the fin structure and extending in a second direction different from the first direction;
a first dielectric structure over the gate structure;
a second dielectric structure extending in the first direction; and
a third dielectric structure separated from the first dielectric structure and the second dielectric structure,
wherein the first dielectric structure and the second dielectric structure comprise a same material.

17. The semiconductor structure of claim 16, wherein the third dielectric structure comprises a material different from that of the first dielectric structure and the second dielectric structure.

18. The semiconductor structure of claim 16, wherein a top surface of the first dielectric structure and a top surface of the second dielectric structure are substantially aligned with each other.

19. The semiconductor structure of claim 16, further comprising a connecting structure disposed over the fin structure, and the first dielectric structure and the second dielectric structure surround the connecting structure from a top view.

20. The semiconductor structure of claim 10, further comprising an epitaxial layer disposed over the fin structure.

* * * * *